US011968630B2

(12) United States Patent
Lee et al.

(10) Patent No.: US 11,968,630 B2
(45) Date of Patent: Apr. 23, 2024

(54) ELECTRONIC DEVICE HAVING SLIDABLE STRUCTURE

(71) Applicant: Samsung Electronics Co., Ltd., Suwon-si (KR)

(72) Inventors: Wonho Lee, Suwon-si (KR); Hojin Jung, Suwon-si (KR); Hyunggwang Kang, Suwon-si (KR); Myunghoon Kwak, Suwon-si (KR); Hyunju Hong, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 154 days.

(21) Appl. No.: 17/531,224

(22) Filed: Nov. 19, 2021

(65) Prior Publication Data
US 2022/0150847 A1    May 12, 2022

Related U.S. Application Data

(63) Continuation of application No. PCT/KR2021/015008, filed on Oct. 25, 2021.

(30) Foreign Application Priority Data

Nov. 6, 2020 (KR) .......... 10-2020-0147381
Feb. 10, 2021 (KR) .......... 10-2021-0019476

(51) Int. Cl.
H04W 52/38       (2009.01)
H04W 52/14       (2009.01)
(Continued)

(52) U.S. Cl.
CPC ......... H04W 52/38 (2013.01); H04W 52/146 (2013.01); H05K 5/0017 (2013.01); H05K 5/0086 (2013.01); H05K 5/0217 (2013.01)

(58) Field of Classification Search
CPC ................ H04W 52/04–60; H05K 5/00–02
See application file for complete search history.

(56) References Cited

U.S. PATENT DOCUMENTS 8,775,103 B1 * 7/2014 Jayaraj ............... H03K 17/955
                                                        702/57
9,374,655 B1 * 6/2016 Lee ...................... H04W 4/80
(Continued)

FOREIGN PATENT DOCUMENTS

CN    108759892 A  * 11/2018 ............ G01D 18/00
CN    111384583 A     7/2020
(Continued)

OTHER PUBLICATIONS

International Search Report dated Feb. 7, 2022, issued in International Patent Application No. PCT/KR2021/015008.

Primary Examiner — Gennadiy Tsvey
(74) Attorney, Agent, or Firm — Jefferson IP Law, LLP

(57) ABSTRACT

A portable electronic device is provided. The portable electronic device includes a housing, a slider unit having an inlet portion configured to retract into the housing, a flexible display, a first antenna, a wireless communication, a state detection sensor, a first grip sensor, a processor, and a memory, processor performs recognizing that the state of the slider unit is changed from first to second state, correcting a capacitance value calculated using the first grip sensor as a correction value using an offset value corresponding to the second state, and a power back-off that lowers the power of a RF signal to be output from the wireless communication circuit to the first antenna using a power back-off value corresponding to the second state when the correction value is equal to or greater than a threshold value corresponding to the second state.

6 Claims, 12 Drawing Sheets

(51) Int. Cl.
  *H05K 5/00* (2006.01)
  *H05K 5/02* (2006.01)

(56) References Cited

U.S. PATENT DOCUMENTS

| | | | |
|---|---|---|---|
| 9,552,020 B2 | 1/2017 | Takasu | |
| 10,013,038 B2 | 7/2018 | Mercer et al. | |
| 10,244,488 B2 | 3/2019 | Lee et al. | |
| 11,147,026 B2 | 10/2021 | Lee et al. | |
| 2007/0166021 A1* | 7/2007 | Yamazaki | H04N 23/6812 |
| | | | 348/E5.046 |
| 2007/0253636 A1* | 11/2007 | Okada | G06T 5/20 |
| | | | 382/264 |
| 2011/0087803 A1* | 4/2011 | Sun | H04J 3/0673 |
| | | | 709/248 |
| 2012/0214422 A1* | 8/2012 | Shi | H04W 52/18 |
| | | | 455/67.11 |
| 2012/0258772 A1* | 10/2012 | Brogle | H01Q 21/28 |
| | | | 455/556.1 |
| 2013/0271342 A1 | 10/2013 | Shen | |
| 2014/0125612 A1* | 5/2014 | Park | G06F 3/0416 |
| | | | 345/173 |
| 2014/0220887 A1* | 8/2014 | Yang | H04B 5/73 |
| | | | 455/41.1 |
| 2014/0239982 A1* | 8/2014 | Alameh | G01R 27/2605 |
| | | | 324/684 |
| 2015/0077140 A1* | 3/2015 | Chu | G06F 3/044 |
| | | | 324/658 |
| 2015/0261295 A1* | 9/2015 | Lee | G06F 3/0486 |
| | | | 345/157 |
| 2016/0124573 A1* | 5/2016 | Rouaissia | H03K 17/955 |
| | | | 345/174 |
| 2016/0124574 A1* | 5/2016 | Rouaissia | H01Q 1/243 |
| | | | 345/174 |
| 2017/0134022 A1* | 5/2017 | Kim | H03K 17/955 |
| 2017/0164300 A1 | 6/2017 | Lee et al. | |
| 2018/0364763 A1* | 12/2018 | Shim | G06F 1/1684 |
| 2019/0196589 A1* | 6/2019 | Shim | H04M 1/0266 |
| 2019/0261519 A1 | 8/2019 | Park et al. | |
| 2019/0268462 A1* | 8/2019 | Yim | H04M 1/656 |
| 2019/0278336 A1* | 9/2019 | Choi | G06F 1/1677 |
| 2020/0021680 A1* | 1/2020 | Rouaissia | H04M 1/72454 |
| 2020/0150819 A1* | 5/2020 | Haraikawa | G06F 3/0421 |
| 2020/0195289 A1* | 6/2020 | Chang | H04W 52/18 |
| 2020/0264660 A1 | 8/2020 | Song et al. | |
| 2020/0329435 A1* | 10/2020 | Lee | G06F 1/1652 |
| 2021/0034195 A1* | 2/2021 | Lee | G01R 27/26 |
| 2021/0185835 A1* | 6/2021 | Song | G02F 1/13332 |
| 2021/0359411 A1* | 11/2021 | Hwang | H01Q 21/28 |

FOREIGN PATENT DOCUMENTS

| | | |
|---|---|---|
| KR | 10-2017-0067548 A | 6/2017 |
| KR | 10-2019-0101184 A | 8/2019 |
| KR | 10-2020-0117741 A | 10/2020 |
| KR | 10-2020-0121199 A | 10/2020 |

* cited by examiner

ELECTRONIC DEVICE HAVING SLIDABLE STRUCTURE

CROSS-REFERENCE TO RELATED APPLICATION(S)

This application is a continuation application, claiming priority under § 365(c), of an International application No. PCT/KR2021/015008, filed on Oct. 25, 2021, which is based on and claims the benefit of a Korean patent application number 10-2020-0147381 filed on Nov. 6, 2020, in the Korean Intellectual Property Office, and of a Korean patent application number 10-2021-0019476 filed on Feb. 10, 2021 in the Korean Intellectual Property Office, the disclosure of which is incorporated by reference herein in its entirety.

TECHNICAL FIELD

The disclosure relates to an electronic device having a slidable structure.

BACKGROUND ART

An electronic device may have a slider (or roller) structure. For example, an electronic device may include a housing, a slider unit, a roller configured such that a part of the slider is retracted into the housing or ejected from the housing, and a flexible display. An antenna provided in the electronic device may have a deviation in performance occurring according to the degree of sliding of the slider unit. For example, the intensity of electromagnetic waves emitted from the antenna may vary depending on the degree of sliding.

The above information is presented as background information only to assist with an understanding of the disclosure. No determination has been made, and no assertion is made, as to whether any of the above might be applicable as prior art with regard to the disclosure.

DISCLOSURE OF INVENTION

Technical Problem

A capacitance value calculated by using data received from a grip sensor may include an internal capacitance component value intrinsically existing in the electronic device when there is no dielectric substance near the electronic device, and an external capacitance component value resulting from a dielectric substance (for example, human body) near the electronic device. The internal capacitance value may vary depending on the relative distance between the grip sensor and the housing and/or the overlapping area therebetween.

Therefore, there may be a need for an internal capacitance component value defined as a different value according to the degree of retraction of the slider unit into the housing. Using an internal capacitance component value that is fixed regardless of the state may cause a problem in that an unnecessary power back-off operation is performed, thereby degrading the radiation performance, or no power back-off operation is performed even when necessary, thereby adversely affecting the human body. The threshold used to determine whether or not to perform the power back-off operation may also vary depending on the degree of retraction of the slider unit into the housing.

In various embodiments, the electronic device may redefine the internal capacitance component value and the threshold, if the state of the electronic device is changed, such that the power back-off operation is performed at the necessary point of time.

Technical problems to be solved in the disclosure are not limited to the above-mentioned technical problems, and other technical problems not mentioned herein will be clearly understood by those skilled in the art to which the disclosure pertains.

Aspects of the disclosure are to address at least the above-mentioned problems and/or disadvantages and to provide at least the advantages described below. Accordingly, an aspect of the disclosure is to provide an electronic device having a slidable structure.

Additional aspects will be set forth in part in the description which follows and, in part, will be apparent from the description, or may be learned by practice of the presented embodiments.

Solution to Problem

In accordance with an aspect of the disclosure, a portable electronic device is provided. The portable electronic device includes a housing, a slider unit having an inlet portion that can be retracted into the housing, a flexible display having a bendable section that is retracted into the housing as the inlet portion is retracted into the housing and is ejected from the housing as the inlet portion is ejected from the housing, a first antenna, a wireless communication circuit configured to be connected to the first antenna, a state detection sensor, a first grip sensor, a processor configured to be connected to the display, the wireless communication circuit, the state detection sensor, and the first grip sensor, and a memory configured to be connected to the processor, wherein the memory stores instructions that, when executed, cause the processor to perform an operation of recognizing that the state of the slider unit is changed from a first state to a second state in which the slider unit is more retracted into the housing or is more ejected from the housing than in the first state based on data received from the state detection sensor, an operation of correcting a capacitance value calculated using the first grip sensor as a correction value using an offset value corresponding to the second state, and a power back-off operation that lowers the power of an RF signal to be output from the wireless communication circuit to the first antenna using a power back-off value corresponding to the second state when the correction value is equal to or greater than a threshold value corresponding to the second state.

In accordance with another aspect of the disclosure, a portable electronic device is provided. The portable electronic device includes a housing, a slider unit having an inlet portion that can be retracted into the housing, a roller configured to allow the inlet portion to be retracted into the housing or ejected from the housing, a flexible display having a bendable section that is retracted into the housing as the inlet portion is retracted into the housing and is ejected from the housing as the inlet portion is ejected from the housing, a first antenna, a wireless communication circuit configured to be connected to the first antenna, a roller driving circuit, a first grip sensor, a processor configured to be connected to the display, the wireless communication circuit, the roller driving circuit, and the first grip sensor, and a memory configured to be connected to the processor, wherein the memory stores instructions that, when executed, cause the processor to perform an operation of controlling the roller driving circuit so that the state of the slider unit is changed from a first state to a second state in which the slider unit is more retracted into the housing or is more ejected from the housing than in the first state in response to a user input, an operation of correcting a capacitance value measured through the first grip sensor as a correction value using an offset value corresponding to the second state, and a power back-off operation that lowers the power of an RF signal to be output from the wireless communication circuit to the first antenna using a power back-off value corresponding to the second state when the correction value is equal to or greater than a threshold value corresponding to the second state.

In accordance with another aspect of the disclosure, a portable electronic device is provided. The portable electronic device includes a housing, a slider unit having an inlet portion that can be retracted into the housing, a flexible display having a bendable section that is retracted into the housing as the inlet portion is retracted into the housing and is ejected from the housing as the inlet portion is ejected from the housing, an antenna, a wireless communication circuit configured to be connected to the antenna, a state detection sensor, a first grip sensor, a processor configured to be connected to the display, the wireless communication circuit, the state detection sensor, and the first grip sensor, and a memory configured to be connected to the processor, wherein the memory stores instructions that, when executed, cause the processor to perform an operation of recognizing an approach of a dielectric through the first grip sensor, an operation of recognizing that the state of the slider unit is changed from a first state to a second state in which the slider unit is more retracted into the housing or is more ejected from the housing than in the first state based on data received from the state detection sensor while the approach of the dielectric is recognized, an operation of correcting a capacitance value measured through the first grip sensor as a correction value using an offset value corresponding to the second state based on the approach of the dielectric and the state change, and a power back-off operation that lowers the power of an RF signal to be output from the wireless communication circuit to the first antenna using a power back-off value corresponding to the second state when the correction value is equal to or greater than a threshold value corresponding to the second state.

Advantageous Effects of Invention

Various embodiments of the disclosure may solve the problem of no power back-off operation performed when a dielectric substance approaches an electronic device having a sliding structure. Various embodiments of the disclosure may prevent the radiation performance of an electronic device having a sliding structure from dropping more than is necessary.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

BEST MODE FOR CARRYING OUT THE INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

Figure 1:
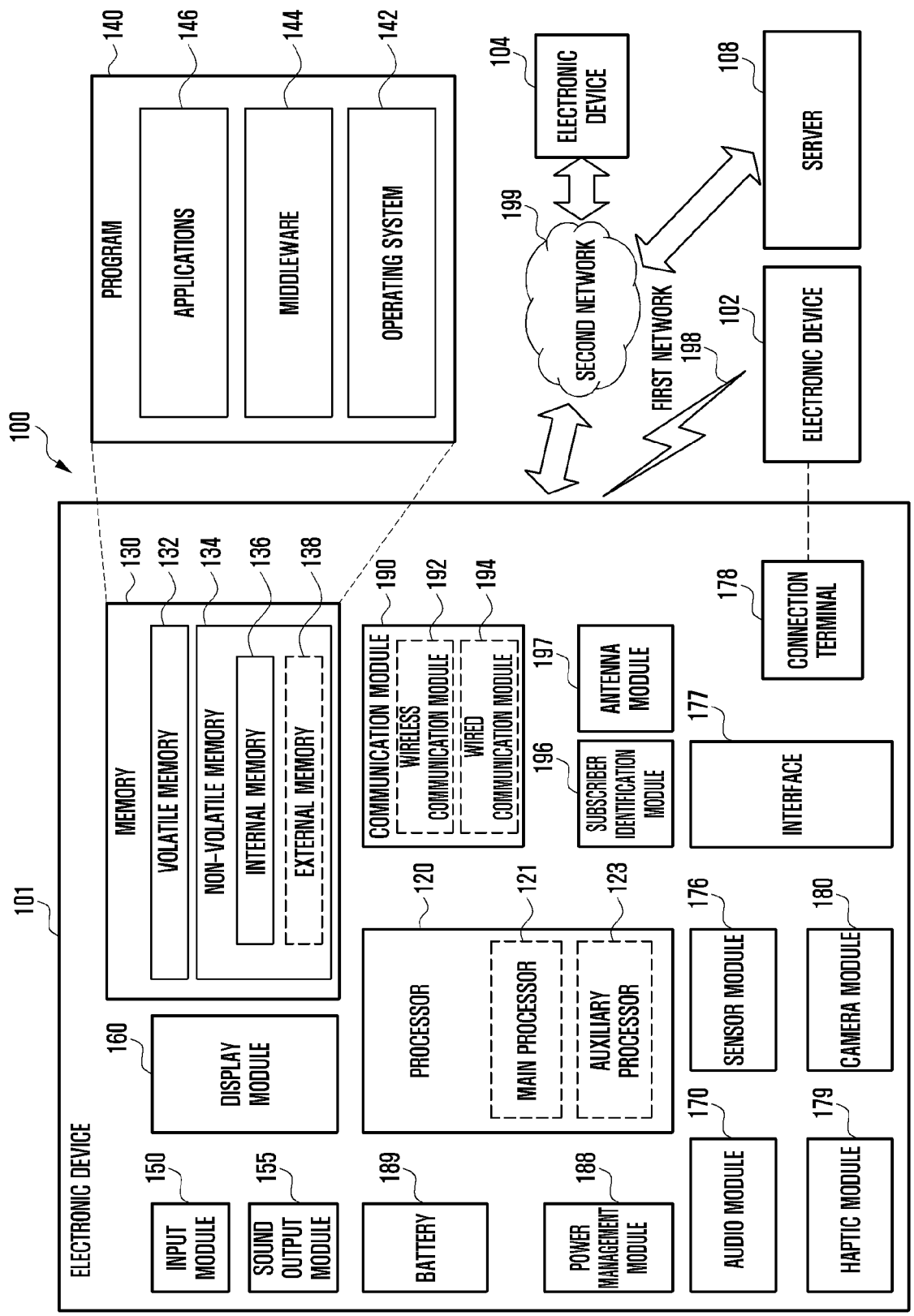
FIG. 1 is a block diagram illustrating an electronic device in a network environment according to an embodiment of the disclosure.

FIG. 1 is a block diagram illustrating an electronic device in a network environment according to an embodiment of the disclosure. Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a $5^{th}$ Generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter (mm) Wave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Hereinafter, for convenience of description, the surface on which the display is visually exposed to a user may be referred to as a front surface of the electronic device

101. In addition, an opposite surface of the front surface may be referred to as a rear surface of the electronic device 101. Also, a surface surrounding a space between the front surface and the rear surface may be referred to as a side surface of the electronic device 101. The term "state" may be referred to the structural form, posture, shape or shape of the electronic device 101 (or the display, slider, or housing constituting the electronic device 101).

Various sliding structures may be applied to the electronic device 101. For example, the electronic device 101 may include a housing, a slider unit, a roller which allows the slider unit to be retracted into and ejected from the housing, and a flexible display. The slider unit may be divided into a portion that can enter the housing (hereinafter, referred to as an inlet portion) and a portion that is kept exposed to the outside. When all the inlet portions of the slider unit are ejected from the housing (e.g., open state, extended state, or slide-out state), the entire display (or most of the display area) can be exposed to the outside through the front side thereof. As the inlet portion of the slider unit is retracted into the housing, the display may also be retracted into the housing. The display may also be divided into a portion (e.g., first display area or first section) that remains exposed to the outside and a portion that can enter the housing (e.g., second display area or second section, or bendable section). When the state is changed to a state (e.g., a closed state, a reduced state, a slide-in state) in which the entire inlet portion of the slider unit is retracted into the housing, the entire second display area of the display may be retracted into the housing. As another example, when the state is changed from the expanded state to the reduced state, a portion of the display (e.g., second display area) may be moved toward the rear surface of the housing through the side surface of the housing without being retracted into the housing. As illustrated above, the electronic device 101 may have a sliding structure in which a portion of the display is retracted into the housing or a sliding structure in which a portion of the display is moved from the front to the rear thereof. In the display, only a portion exposed through the front surface may be determined as an active area for displaying visual information. A portion retracted into the housing or moved to the rear surface thereof may be determined as an inactive area.

Figure 2A:
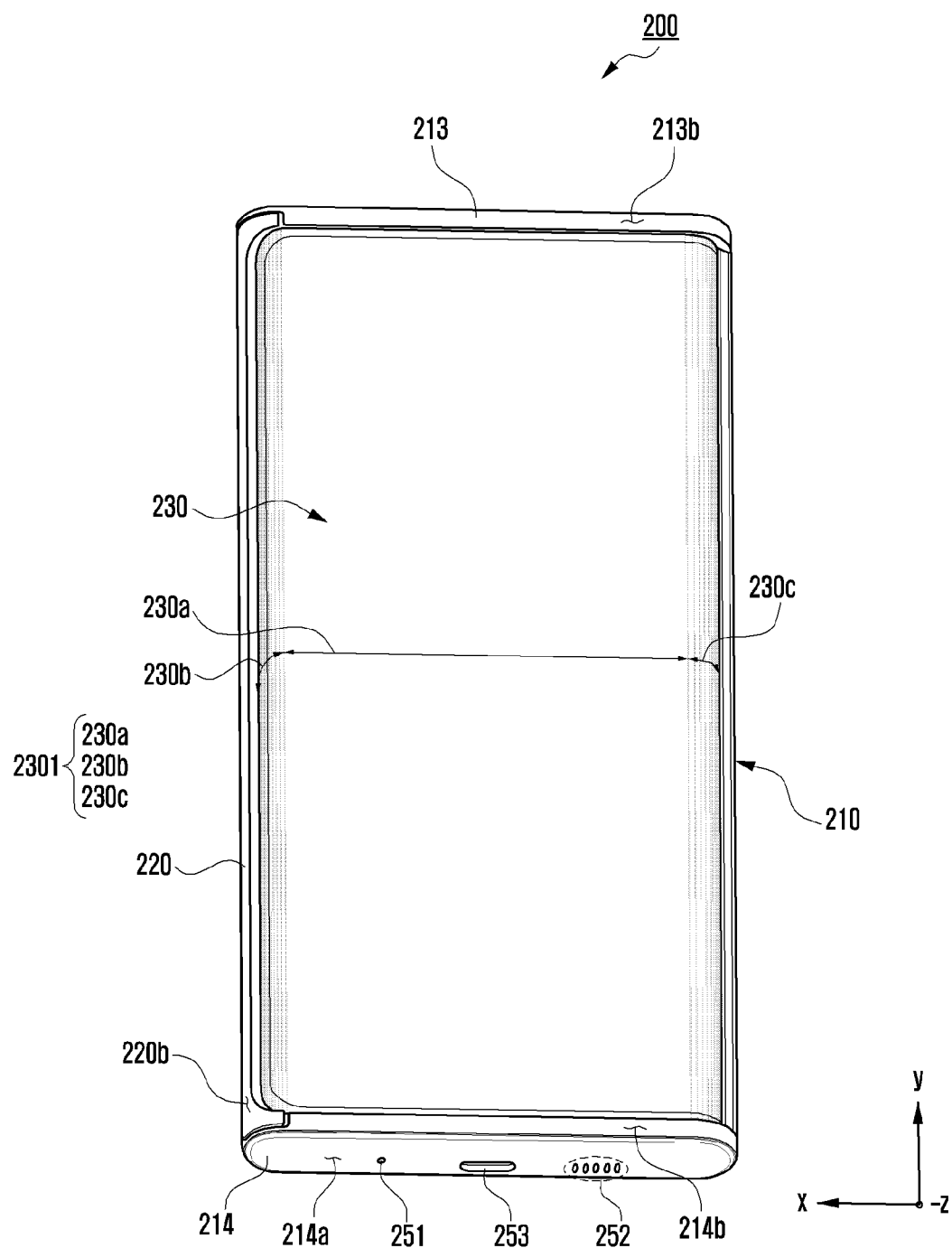
FIG. 2A is a front perspective view illustrating an electronic device in a closed state according to an embodiment of the disclosure.

FIG. 2A is a front perspective view illustrating an electronic device in a closed state according to an embodiment of the disclosure.

Figure 2B:
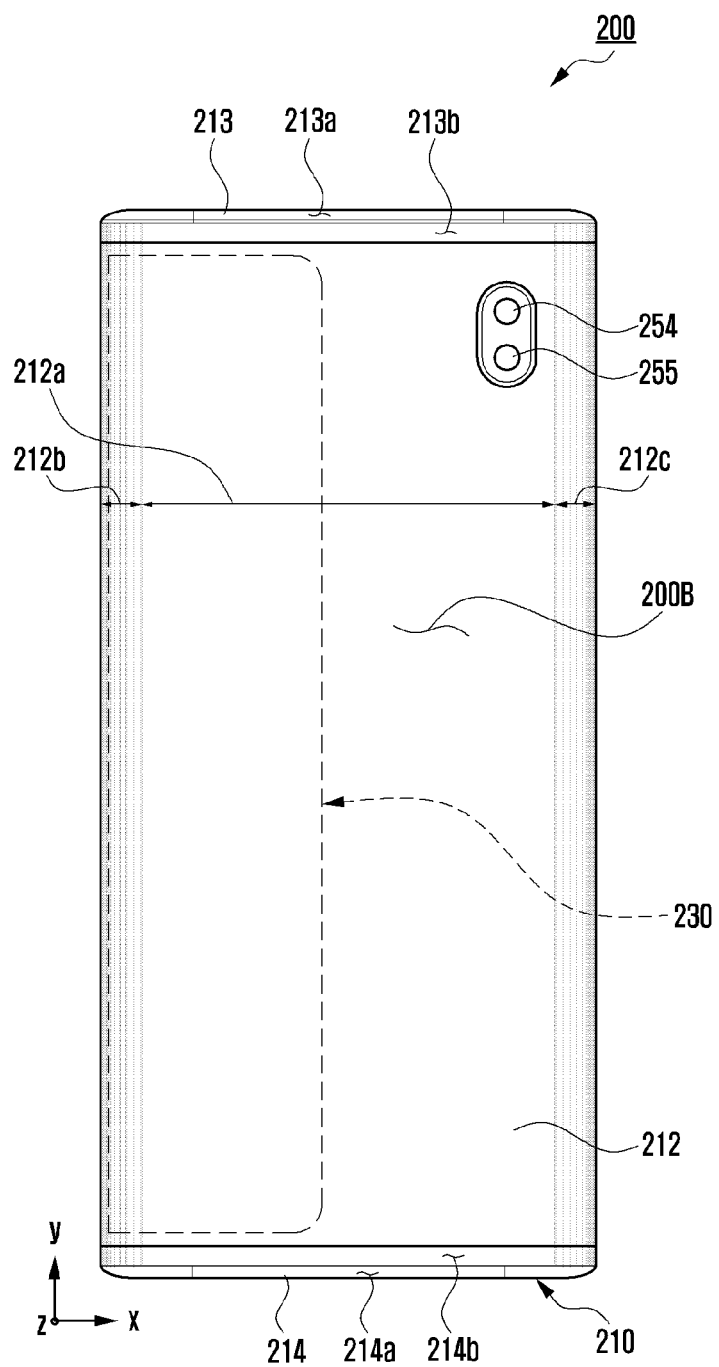
FIG. 2B is a rear perspective view illustrating an electronic device in a closed state according to an embodiment of the disclosure.

FIG. 2B is a rear perspective view illustrating an electronic device in a closed state according to an embodiment of the disclosure.

Figure 3A:
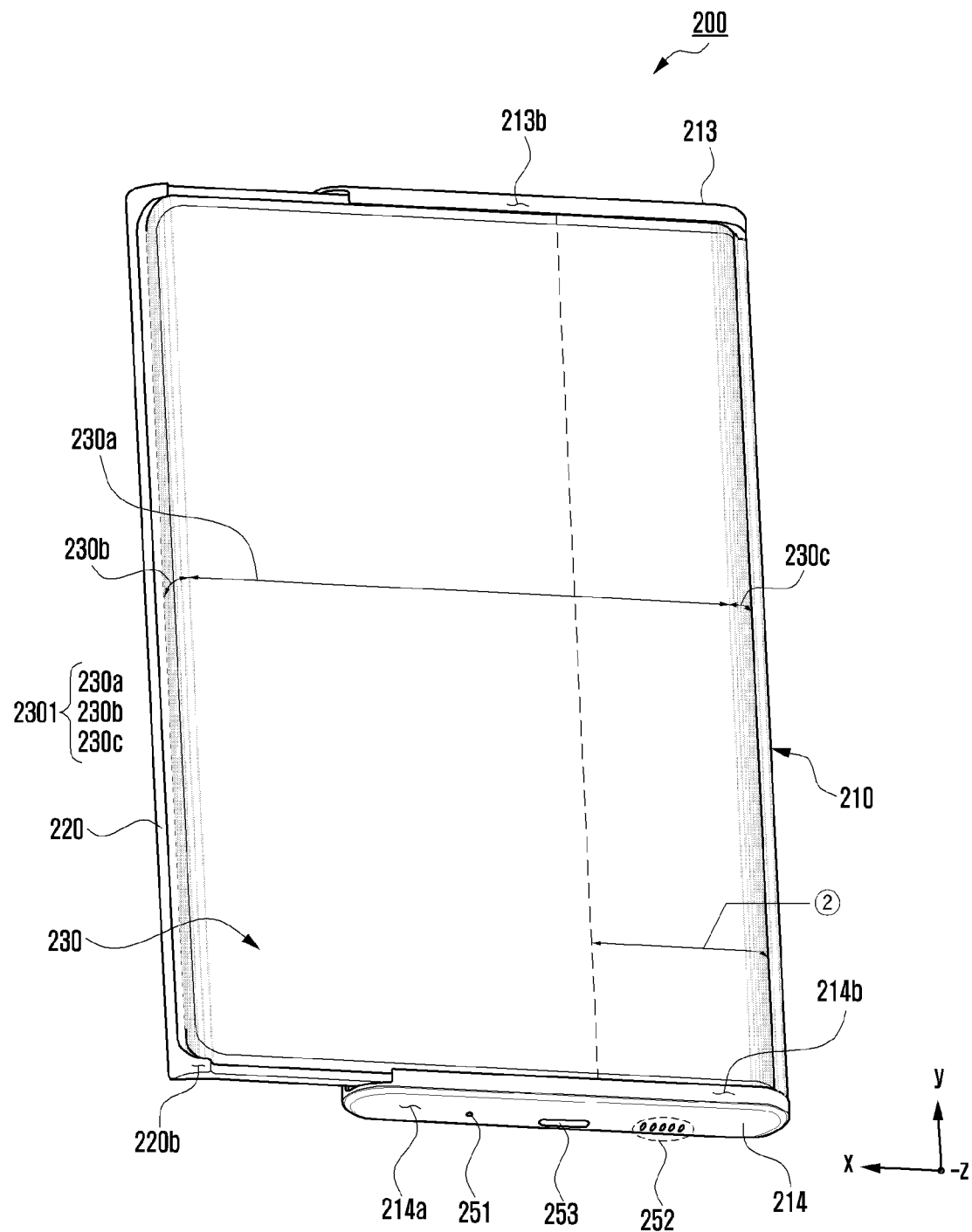
FIG. 3A is a front perspective view illustrating an electronic device in an open state according to an embodiment of the disclosure.

FIG. 3A is a front perspective view illustrating an electronic device in an open state according to an embodiment of the disclosure.

Figure 3B:
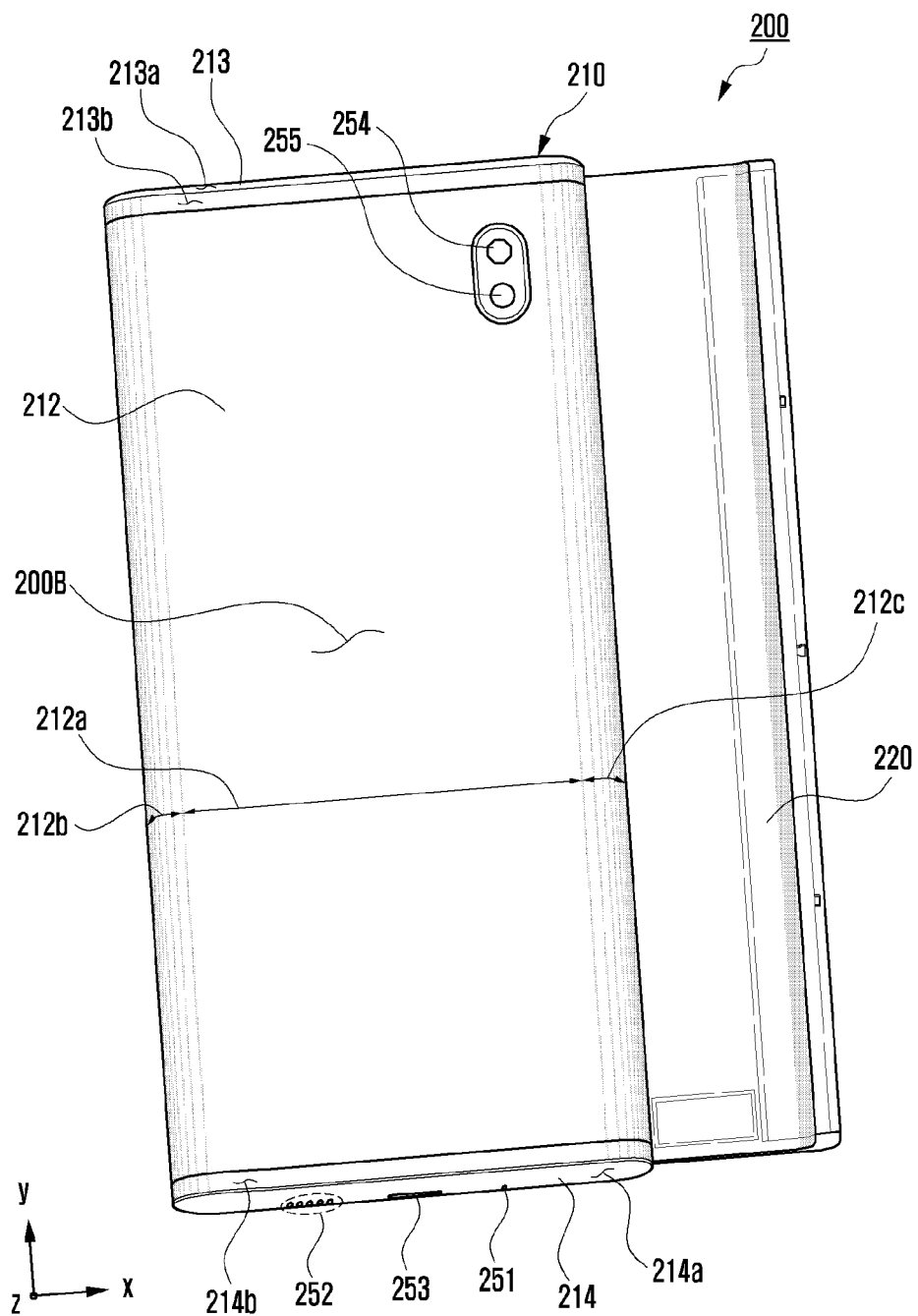
FIG. 3B is a rear perspective view illustrating an electronic device in an open state according to an embodiment of the disclosure.

FIG. 3B is a rear perspective view illustrating an electronic device in an open state according to an embodiment of the disclosure.

Referring to FIGS. 2A, 2B, 3A, and 3B, an electronic device 200 (e.g., the electronic device 101 of FIG. 1) may be implemented to expand a screen 2301 in a sliding manner. For example, the screen 2301 may be an externally viewed area of the flexible display (i.e., display 230). FIGS. 2A and 2B illustrate the electronic device 200 in a state in which the screen 2301 is not expanded, and FIGS. 3A and 3B illustrate the electronic device 200 in a state in which the screen 2301 is expanded. The state in which the screen 2301 is not expanded is a state in which the slider unit (or a sliding plate) 220 for the sliding motion of the display 230 is not slide-out, and hereinafter, may be referred to as a "closed state". The state in which the screen 2301 is expanded is a fully expanded state in which the screen 2301 is no longer expanded due to the slide-out of the slider unit 220, and hereinafter, may be referred to as an "open state". For example, the slide-out may mean that at least a portion of the slider unit 220 is moved in a first direction (e.g., +x axis direction) when the electronic device 200 is switched from the closed state to the open state. According to various embodiments, the open state may be defined as a state in which the screen 2301 is expanded compared to the closed state, and screens of various sizes may be provided according to the moved position of the slider unit 220. According to various embodiments, an intermediated state (or free stop state) may indicate a state between the closed state of FIG. 2A and the open state of FIG. 3A. The screen 2301 may include an active area of the display 230 that is visually exposed to output an image, and the electronic device 200 may adjust the active area according to the movement of the slider unit 220 or the movement of the display 230. In the following description, the open state may refer to a state in which the screen 2301 is fully expanded. In some embodiments, the display 230 that is slidably disposed on the electronic device 200 of FIG. 2A and provides the screen 2301 may also be referred to as a "slide-out display" or an "expandable display".

According to an embodiment, the electronic device 200 may include a sliding structure related to the display 230. For example, when the display 230 is moved to a predetermined distance by an external force, due to the elastic structure included in the sliding structure, the electronic device can be switched from the closed state to the open state or from the open state to the closed state without any further external force (e.g., semi-automatic slide motion).

According to some embodiments, when a signal is generated through an input device included in the electronic device 200, the electronic device 200 can be switched from the closed state to the open state or from the open state to the closed state due to a driving circuit such as a motor connected to the display 230. For example, when a signal is generated through a hardware button or a software button provided through the screen 2301, the electronic device 200 may be switched from the closed state to the open state or from the open state to the closed state.

According to various embodiments, when a signal is generated from various sensors such as a pressure sensor, the electronic device 200 may be switched from the closed state to the open state or from the open state to the closed state. For example, when the electronic device 200 is carried or held by a user's hand, a squeeze gesture in which a part of the hand (e.g., palm or finger) presses within a designated section of the electronic device 200 may be detected by the sensor, and in response to the detection, the electronic device 200 may be switched from the closed state to the open state or from the open state to the closed state.

According to an embodiment, the display 230 may include a second section ② (see FIG. 3A). The second section ② may include an extended portion of the screen 2301 when the electronic device 200 is switched from the closed state to the open state. When the electronic device 200 is switched from the closed state to the open state, the second section ② may be ejected from the inner space of the electronic device 200 in a sliding manner, and thus the screen 2301 may be expanded. When the electronic device 200 is switched from the open state to the closed state, at least a portion of the second section ② may be retracted into the inner space of the electronic device 200 in a sliding manner, and thus the screen 2301 may be reduced. When the electronic device 200 is switched from the open state to the closed state, at least a portion of the second section ② may be bent and moved to the inner space of the electronic device 200. For example, the display 230 may include a flexible substrate (e.g., a plastic substrate) made of a polymer material including polyimide (PI) or polyester (PET). The second section ② is a portion that is bent in the display 230 when the electronic device 200 is switched between the open state and the closed state, and may be referred to as, for example, a bendable section. In the following description, the second section ② is referred to as a bendable section.

According to an embodiment, the electronic device 200 may include a housing 210, a slider unit 220, or the display 230.

The housing (or case) 210 may, for example, include a back cover 212, a first side cover 213, or a second side cover 214. The back cover 212, the first side cover 213, or the second side cover 214 may be connected to a support member (not shown) positioned inside the electronic device 200, and may form at least a portion of the appearance of the electronic device 200.

The back cover 212 may form, for example, at least a portion of a rear surface 200B of the electronic device 200. In an embodiment, the back cover 212 may be substantially opaque. For example, the back cover 212 may be made of coated or tinted glass, ceramic, polymer, metal (e.g., aluminum, stainless steel (STS), or magnesium), or a combination of at least two of the above-mentioned materials. According to some embodiments, in a state in which the bendable section ② of the display 230 is retracted into the inner space of the housing 210 (e.g., in the closed state), at least a portion of the bendable section ② may be arranged to be visible from the outside through the back cover 212. In this case, the back cover 212 may be made of a transparent material and/or a translucent material.

According to an embodiment, the back cover 212 may include a planar portion 212a and curved portions 212b and 212c positioned at opposite sides with the planar portion 212a interposed therebetween. The curved portions 212b and 212c may be formed adjacent to relatively long edges (not shown) at both sides of the back cover 212, respectively, and may be bent toward the screen positioned opposite the back cover 212 to extend seamlessly. According to some embodiments, the back cover 212 may include one of the curved portions 212b and 212c or may be implemented without the curved portions 212b and 212c.

According to an embodiment, the first side cover 213 and the second side cover 214 may be positioned opposite each other with the display 230 interposed therebetween in a second direction (e.g., y-axis direction) orthogonal to the first direction (e.g., +x-axis direction) of the slide-out of the slider unit 220. The first side cover 213 may form at least a portion of a first side surface (or upper surface) 213a of the electronic device 200, and the second side cover 214 may form at least a portion of a second side surface (or lower surface) 214a of the electronic device facing in a direction opposite the first side surface 213a. The first side cover 213 may include a first edge portion (or a first rim) 213b extending from the edge of the first side surface 213a. For example, the first edge portion 213b may form at least a portion of one side bezel of the electronic device 200. The second side cover 214 may include a second edge portion (or second rim) 214b extending from the edge of the second side surface 214a. For example, the second edge portion 214b may form at least a portion of the other bezel of the electronic device 200. According to an embodiment, in the closed state of FIG. 2A, the surface of the first edge portion 213b, the surface of the second edge portion 214b, and the surface of the slider unit 220 may be smoothly connected to one another, thereby forming one side curved portion (not shown) corresponding to the side of the first curved portion 230b of the screen 2301. According to various embodiments, the surface of the first edge portion 213b or the surface of the second edge portion 214b may include the other side curved portion (not shown) corresponding to the side of the second curved portion 230c of the screen 2301 positioned on the side opposite the first curved portion 230b.

According to an embodiment, the slider unit 220 may slide on a support member (not shown) positioned inside the electronic device 200. At least a portion of the display 230 may be disposed on the slider unit 220, and the closed state of FIG. 2A or the open state of FIG. 3A may be achieved based on the position of the slider unit 220 on the support member. The slider unit 220 serves to support at least a portion of the display 230, and may be referred to as a display support structure in some embodiments.

According to an embodiment, the slider unit 220 may include a third edge portion 220b that forms at least a portion of an outer surface (e.g., a surface exposed to the outside to form an exterior of the electronic device 200) of the electronic device 200. For example, in the closed state of FIG. 2A, the third edge portion 220b may form a bezel around the screen together with the first edge portion 213b and the second edge portion 214b. The third edge portion 220b may extend in the second direction (e.g., the y-axis direction) to connect one end of the first side cover 213 and one end of the second side cover 214 in the closed state. For example, in the closed state of FIG. 2A, the surface of the third edge portion 220b may be smoothly connected to the surface of the first edge portion 213b and/or the surface of the second edge portion 214b.

According to an embodiment, due to the slide-out of the slider unit 220, at least a portion of the bendable section ② comes out from the inside of the electronic device 200 so that a state (e.g., the open state) in which the screen 2301 is expanded as shown in FIG. 3A may be provided.

According to an embodiment, in the closed state of FIG. 2A, the screen 2301 may include a planar portion 230a, and a first curved portion 230b and/or a second curved portion 230c positioned on opposite sides with the planar portion 230a interposed therebetween. For example, the first curved portion 230b and the second curved portion 230c may be substantially symmetrical with the planar portion 230a interposed therebetween. When the state of the slider unit is switched from the closed state to the open state, the planar portion 230a may be expanded. For example, a partial area of the bendable section ② forming the second curved portion 230c in the closed state of FIG. 2A may be included in the planar portion 230a expanded when the closed state of FIG. 2A is switched to the open state of FIG. 3A, and may be formed as another area of the bendable section ②.

According to an embodiment, the electronic device 200 may include an opening (not shown) for entering or withdrawing the bendable section ②, and/or a pulley (not shown) positioned in the opening. The pulley may be positioned to correspond to the bendable section ②, and the movement of the bendable section ② and the movement direction thereof may be guided through the rotation of the pulley in the transition between the closed state of FIG. 2A and the open state of FIG. 3A. The first curved portion 230b may be formed to correspond to a curved surface formed on one surface of the slider unit 220. The second curved portion 230c may be formed by a portion corresponding to the curved surface of the pulley in the bendable section ②. The first curved portion 230b may be positioned on the opposite side of the second curved portion 230c in the closed or open state of the electronic device 200 to improve the aesthetics of the screen 2301. According to some embodiments, the planar portion 230a may be implemented in an expanded form without the first curved portion 230b.

According to an embodiment, the electronic device 200 may include a microphone hole 251 (e.g., the input module 150 of FIG. 1), a speaker hole 252 (e.g., the sound output module 155 of FIG. 1), a connector hole 253 (e.g., the connectivity terminal 178 of FIG. 1), a camera module 254 (e.g., the camera module 180 of FIG. 1), or a flash 255. The holes 251, 252, and 253 may be provided on the second side surface 214a. The camera module 254 and the flash 255 may be disposed on, for example, the rear surface 200B of the electronic device 200. According to various embodiments, the flash 255 may be implemented by being included in the camera module 254. In some embodiments, the electronic device 200 may omit at least one of the components or additionally include other components.

According to various embodiments, the electronic device 200 may include a sensor module (e.g., the sensor module 176 of FIG. 1). For example, the sensor module may include at least one of a gesture sensor, a gyro sensor, a barometric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

Figure 4:
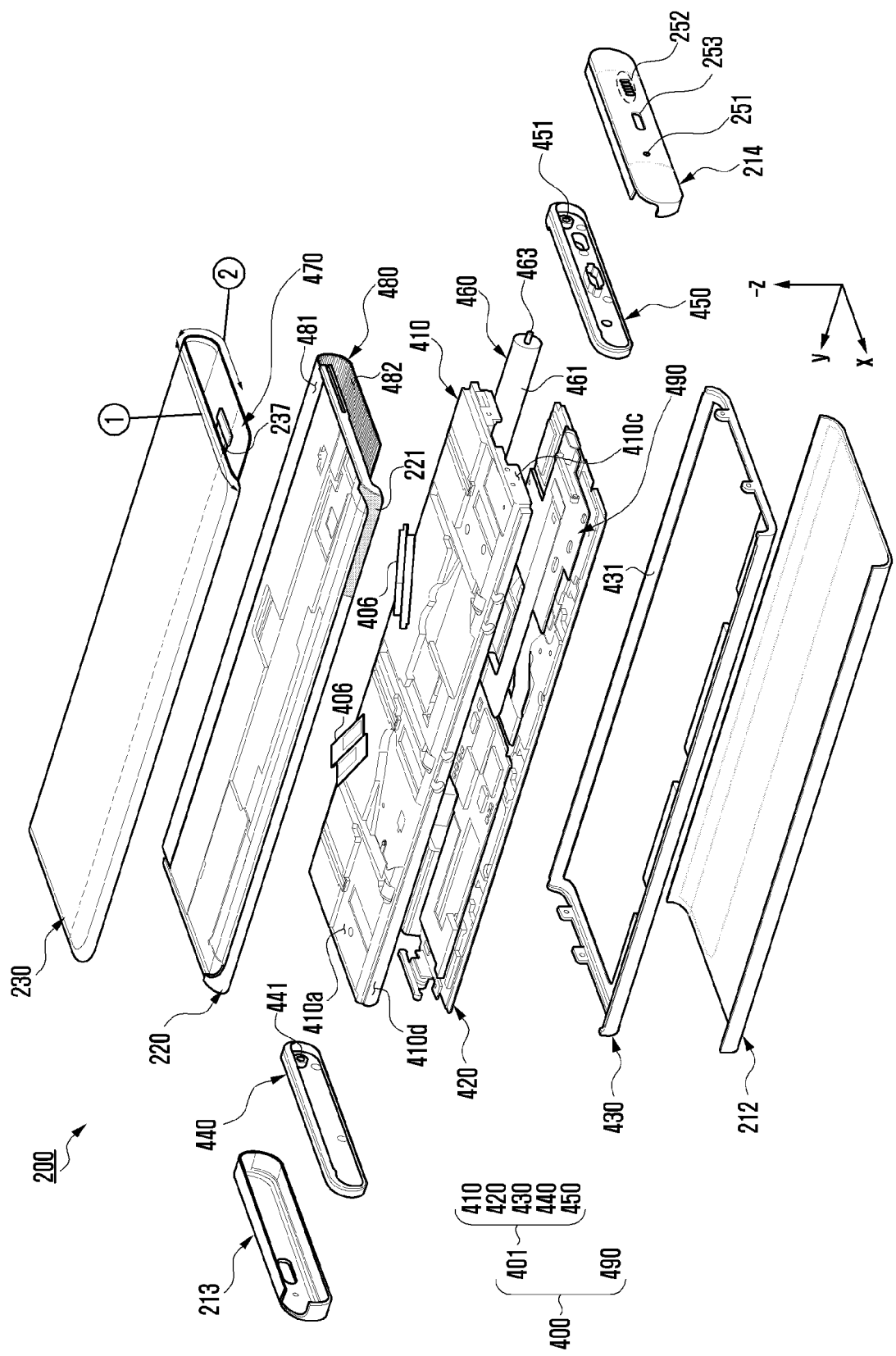
FIG. 4 is an exploded perspective view illustrating an electronic device of FIG. 2A according to an embodiment of the disclosure.

FIG. 4 is an exploded perspective view illustrating an electronic device of FIG. 2A according to an embodiment of the disclosure.

Referring to FIG. 4, in an embodiment, the electronic device 200 may include the back cover 212, the first side cover 213, the second side cover 214, a main portion 400, a pulley 460, a slider unit 220, a display 230, a support sheet 470, or a multi-bar structure (or multi-bar assembly) 480. The main portion 400 may include a support member assembly 401, a printed circuit board (PCB) 490, a flexible PCB (FPCB), or a rigid-flex PCB (RFPCB). Hereinafter, in the description of FIG. 4, portions overlapping with those of FIGS. 2A to 3B may be omitted or briefly described.

According to an embodiment, the support member assembly (or support structure) 401 is a frame structure capable of withstanding a load, and may contribute to durability or rigidity of the electronic device 200. At least a portion of the support member assembly 401 may include a non-metallic material (e.g., a polymer) or a metallic material. The housing 210 (see FIG. 2A) including the back cover 212, the first side cover 213, or the second side cover 214, the pulley 460, the slider unit 220, the display 230, the support sheet 470, the multi-bar structure 480, or the PCB 490 may be disposed or coupled to the support member assembly 401.

According to an embodiment, the support member assembly 401 may include a first support member 410, a second support member 420, a third support member 430, a fourth support member 440, or a fifth support member 450.

The first support member (or first bracket) 410 may be, for example, in the form of a plate. The slider unit 220 may be disposed on one surface 410a of the first support member 410. The second support member (or second bracket) 420 may be in the form of a plate overlapping at least a portion of the first support member 410 when viewed in the z-axis direction, or may be coupled to the first support member 410 and/or the third support member 430. The second support member 420 may be positioned between the first support member 410 and the third support member 430. The third support member 430 may be coupled to the first support member 410 and/or the second support member 420 with the second support member 420 interposed therebetween. The PCB 490 may be disposed on the second support member 420 between the first support member 410 and the second support member 420. The fourth support member 440 may be coupled to one side of an assembly (or structure) (not shown) to which the first support member 410, the second support member 420, and the third support member 430 are coupled. The fifth support member 450 may be coupled to the other side of the assembly (or structure) (not shown) to which the first support member 410, the second support member 420, and the third support member 430 are coupled, and may be positioned on a side opposite the fourth support member 440. The first side cover 213 may be coupled to the support member assembly 401 from the side of the fourth support member 440. The second side cover 214 may be coupled to the support member assembly 401 from the side of the fifth support member 450. The back cover 212 may be coupled to the support member assembly 401 from the side of the third support member 430.

According to various embodiments, at least two or more of the first support member 410, the second support member 420, the third support member 430, the fourth support member 440, and the fifth support member 450 may be integrally implemented. According to some embodiments, the support member assembly 401 may refer to a structure forming at least some of the first support member 410, the second support member 420, the third support member 430, the fourth support member 440, and the fifth support member 450. According to some embodiments, some of the first support member 410, the second support member 420, the third support member 430, the fourth support member 440, and the fifth support member 450 may be omitted.

The first support member 410 may include, for example, a first side surface (not shown) that faces the fourth support member 440, a second side surface 410c that faces the fifth support member 450 and is positioned on a side opposite the first side surface, a third side surface (or right surface) that connects one end of the first side surface and one end of the second side surface 410c, or a fourth side surface (or left surface) 410d that connects the other end of the first side surface and the other end of the second side surface 410c and is positioned at a side opposite the third side surface. According to an embodiment, the pulley 460 may be located near the third side surface of the first support member 410. As another example, in the case of an electronic device in which the slide-out direction is reversed, the pulley 460 may be located near the fourth side surface 410d of the first support member 410. The pulley 460 may include a cylindrical roller 461 extending in a direction (e.g., a +y-axis direction) from the fifth support member 450 to the fourth support member 440. The pulley 460 may include a first rotation shaft (not shown) and a second rotation shaft 463 connected to the roller 461, and the first rotation shaft and the second rotation shaft 463 may be positioned on opposite sides of each other with the rollers 461 interposed therebetween. The first rotation shaft may be positioned between the roller 461 and the first side cover 213 and may be connected to the fourth support member 440. The second rotation shaft 463 may be positioned between the roller 461 and the second side cover 214 and may be connected to the fifth support member 450. The fourth support member 440 may include a first through-hole 441 into which the first rotation shaft is inserted, and the fifth support member 450 may include a second through-hole 451 into which the second rotation shaft 463 is inserted. The roller 461 may be rotatable based on the first rotation shaft disposed on the fourth support member 440 and the second rotation shaft 463 disposed on the fifth support member 450.

According to an embodiment, the slider unit 220 may be disposed on the support member assembly 401 to be slidably movable on the first support member 410. For example, a sliding structure for supporting and guiding coupling between the first support member 410 and the slider unit 220 and movement of the slider unit 220 may be provided. According to an embodiment, the sliding structure may include at least one resilient structure 406. When the slider unit 220 is moved to a predetermined distance by an external force, due to the at least one resilient structure 406, the state of the electronic device may be switched from the closed state of FIG. 2A to the open state of FIG. 3A or from the open state of FIG. 2A to the closed state of FIG. 3A without further external force. The at least one resilient structure 406 may include, for example, various resilient members such as a torsion spring. For example, the torsion spring as the resilient structure 406 may include one end connected to the slider unit 220, the other end connected to the first support member 410, and a spring between the one end and the other end. When the slider unit 220 is moved by an external force to a predetermined distance in a first direction (e.g., +x axis direction) of the slide-out, the position of the one end with respect to the other end is changed so that the slider unit 220 may be moved in the first direction due to the elasticity of the spring without further external force, and thus the electronic device may be switched from the closed state of FIG. 2A to the open state of FIG. 3A. When the slider unit 220 is moved by an external force to a predetermined distance in a second direction (e.g., −x axis direction) opposite the first direction, the position of the one end with respect to the other end is changed so that the slider unit 220 may be moved in the second direction due to the elasticity of the spring without further external force, and thus the electronic device may be switched from the open state of FIG. 3A to the closed state of FIG. 2A.

According to various embodiments, a portion of the support member assembly 401 in the main portion 400 may be made of a conductor (e.g., a metal material). For example, a portion of the fifth support member 450 and/or a portion adjacent to the fifth support member 450 in the first support member 410 may be made of a conductor. These conductors can be used as an antenna for a wireless communication circuit to communicate with an external electronic device through a wireless communication network (e.g., legacy cellular network, 5G network, next-generation communication network, Internet, or telecommunication network such as computer network (e.g., LAN or WAN)). In addition, the conductor may be electrically connected to a first grip sensor (not shown). For example, the first grip sensor may be mounted on the main portion 400 (e.g., the PCB 490) adjacent to the conductor. The processor may measure a capacitance formed between the conductor and the ground (e.g., the ground of the PCB 490) through the first grip sensor, and based on the capacitance value, may determine whether to perform a power back-off operation that lowers the power of an RF signal to be output to the antenna.

The processor may recognize that a dielectric (e.g., finger, palm, or face) is adjacent to the electronic device 200 from the first grip sensor through the conductor provided in the main portion 400. The first grip sensor may be electrically separated from the slider unit 220. Accordingly, a second grip sensor for recognizing that the dielectric approaches the slider unit 220 may be mounted on the slider unit 220.

According to various embodiments, a portion of the slider unit 220 may be formed of a conductor (e.g., a metal material). For example, a conductive portion 221 adjacent to the fifth support member 450 in the slider unit 220 may be formed of a conductor. The conductive portion 221 may be connected to the second grip sensor (not shown). For example, the second grip sensor may be mounted on the slider unit 220 adjacent to the conductive portion 221. The processor may measure a capacitance between the conductive portion 221 and the ground (e.g., the ground of the PCB 490) through the second grip sensor, and based on the capacitance value, may determine whether to perform a power back-off operation that lowers the power of an RF signal to be output to the antenna. Additionally, the conductive portion 221 can be used as an antenna for a wireless communication circuit to communicate with an external electronic device through a wireless communication network (e.g., legacy cellular network, 5G network, next-generation communication network, Internet, or telecommunication network such as computer network (e.g., LAN or WAN)).

According to various embodiments, the housing 210 may be defined to further include at least a portion of the support member assembly 401. For example, the housing 210 may include one surface (e.g., one surface 410a formed by the first support member 410) facing the first direction (e.g., the +z-axis direction), and the other surface (e.g., the rear surface 200B of FIG. 2B) facing the second direction (e.g., −z-axis direction) opposite the first surface 410a. The slider unit 220 may be slidably disposed on one surface (e.g., the one surface 410a formed by the first support member 410) of the housing 210 in a third direction (e.g., the x-axis direction) perpendicular to the first direction. According to an embodiment, the display 230 may include a first section ① extending from the bendable section ②. The first section ① may be disposed on the slider unit 220. When the electronic device is switched from the closed state of FIG. 2A to the open state of FIG. 3A, the bendable section ② connected to the first section ① may come out in a slidable manner due to the movement of the slider unit 220 and the screen (see the screen 2301 of FIG. 3A) may be extended. When the electronic device is switched from the open state of FIG. 2A to the closed state of FIG. 3A, due to the movement of the slider unit 220, at least a portion of the bendable section ② enters the electronic device 200 and the screen (the screen 2301 of FIG. 2A) may be reduced. The support member assembly 401 may include an opening (not shown) for entering or withdrawing the bendable section ②, and the pulley 460 may be located in the opening. The opening may include a gap at one side between the first support member 410 and the third support member 430, and a portion 431 of the third support member 430 adjacent to the opening may have a curved shape corresponding to the curved surface of the roller 461. The pulley 460 may be positioned to correspond to the bendable section ②, and in the transition between the closed state of FIG. 2A and the open state of FIG. 3A, the pulley 460 may be rotated by the movement of the bendable section ②.

According to an embodiment, the state of the electronic device 200 may be defined based on the rotation angle of the roller 461 (e.g., the rotation angle of the roller in a direction (e.g., clockwise) in which the display 230 is unwound from the roller). For example, when the rotation angle of the roller exceeds a first threshold value, the state of the electronic device 200 may be defined as a first state (e.g., a closed state, a normal state, a reduced state, or a slide-in state) in which only the first section ① of the display 230 is exposed (or the bendable section ② is disposed in the internal space). When the rotation angle of the roller exceeds a second threshold value greater than the first threshold value, the state of the electronic device 200 may be defined as a second state (e.g., an open state, an extended state, or a slide-out state) in which the entire display of the display 230 (e.g., the first section ① and the bendable section ②) is exposed. The bendable section ② may be maintained in a partially exposed (or partially hidden) state (e.g., an intermediate state).

According to an embodiment, the state of the electronic device 200 may be defined based on a curvature (degree of curvature) of a designated portion on the display 230. For example, when the curvature of the bendable section ② corresponds to a value (or within a range) indicating concavity (or convexity), the state of the electronic device 200 may be defined as the first state. When the curvature of the bendable section ② corresponds to a value (or within a range) indicating flatness, the state of the electronic device 200 may be defined as a second state.

According to an embodiment, the support sheet 470 may be attached to the rear surface of the display 230. The rear surface of the display 230 may indicate a surface positioned opposite a surface from which light is emitted from a display panel including a plurality of pixels. The support sheet 470 may contribute to durability of the display 230. The support sheet 470 may reduce the effect of a load or stress on the display 230 that may occur in the transition between the closed state of FIG. 2A and the open state of FIG. 3A. When the slider unit 220 is moved, the support sheet 470 may prevent the display 230 from being damaged by a force transmitted from the movement of the slider unit 220.

The support sheet 470 may be made of various metallic materials and/or non-metallic materials (e.g., polymers). According to an embodiment, the support sheet 470 may include stainless steel. According to some embodiments, the support sheet 470 may include an engineering plastic. According to some embodiments, the support sheet 470 may be implemented integrally with the display 230. According to an embodiment, the support sheet 470 may include a lattice structure (not shown) that at least partially overlaps a portion (e.g., the bendable section ② of FIG. 3A or FIG. 4 or the first curved portion 230b of FIG. 2A or FIG. 3A) in which the display 230 is bent and disposed. The lattice structure may include a plurality of openings or a plurality of slits and may contribute to the flexibility of the display 230. According to various embodiments, the support sheet 470 may include a recess pattern (not shown) including a plurality of recesses, replacing the lattice structure, and the recess pattern may contribute to the flexibility of the display 230. According to various embodiments, the lattice structure or the recess pattern may extend to at least a portion of the planar portion 230a of FIG. 2A or 3A. According to various embodiments, the support sheet 470 including the lattice structure or the recess pattern or a conductive member corresponding thereto may be formed of a plurality of layers.

According to an embodiment, the multi-bar structure 480 may be connected to the slider unit 220, and may include a first surface 481 facing the support sheet 470 and a second surface 482 positioned on a side opposite the first surface 481. When the slider unit 220 moves, the movement and direction of the multi-bar structure 480 may be guided by the roller 461 that rotates in friction with the second surface 482. According to an embodiment, the second surface 482 may include a form in which a plurality of bars (not shown) extending in a direction (e.g., +y-axis direction) from the second rotation shaft 463 of the pulley 460 to the first rotation axis (not shown) are arranged. The multi-bar structure 480 may be bent at portions having a relatively thin thickness between the plurality of bars. In various embodiments, this multi-bar structure 480 may be referred to other terms such as a "flexible track" or a "hinge rail".

According to an embodiment, in the closed state of FIG. 2A or the open state of FIG. 3A, at least a portion of the multi-bar structure 480 may be positioned to overlap the screen 2301 (see FIG. 2A or 3A), and may support the bendable section ② so that the bendable section ② of the display 230 is smoothly connected to the first section ① of the display 230 without lifting. The multi-bar structure 480 may contribute to the movement of the bendable section ② while maintaining a smooth connection between the bendable section ② and the first section ① in the transition between the closed state of FIG. 2A and the open state of FIG. 3A.

According to an embodiment, on the PCB 490 in the main portion 400, a processor (e.g., the processor 120 of FIG. 1), a memory (e.g., the memory 130 of FIG. 1), an interface (e.g., the interface 177 of FIG. 1), a communication module (e.g., the communication module 190 of FIG. 1), or an antenna module (e.g., the antenna module 197 of FIG. 1) may be mounted.

The electronic device 200 may include various other elements disposed on the PCB 490 or electrically connected to the PCB 490. For example, the electronic device 200 may include a battery (not shown) positioned between the first support member 410 and the second support member 420 or between the second support member 420 and the back cover 212. According to an embodiment, the electronic device 200 may include an antenna (not shown) positioned between the first support member 410 and the second support member 420 or between the second support member 420 and the back cover 212. The antenna (not shown) may include, for example, a near field communication (NFC) antenna, a wireless charging antenna, and/or a magnetic secure transmission (MST) antenna. The antenna (not shown) may perform, for example, short-range communication with an external device or may wirelessly transmit/receive power required for charging. In another embodiment, the antenna structure may be formed by a portion of the first side cover 213 and/or the second side cover 214 or a combination thereof.

According to an embodiment, the electronic device 200 may include a flexible printed circuit board (FPCB) 237 that electrically connects the display 230 and the PCB 490. For example, the FPCB 237 may be electrically connected to the PCB 490 through the opening (not shown) formed in the slider unit 220 and the opening (not shown) formed in the first support member 410.

Figure 5A:
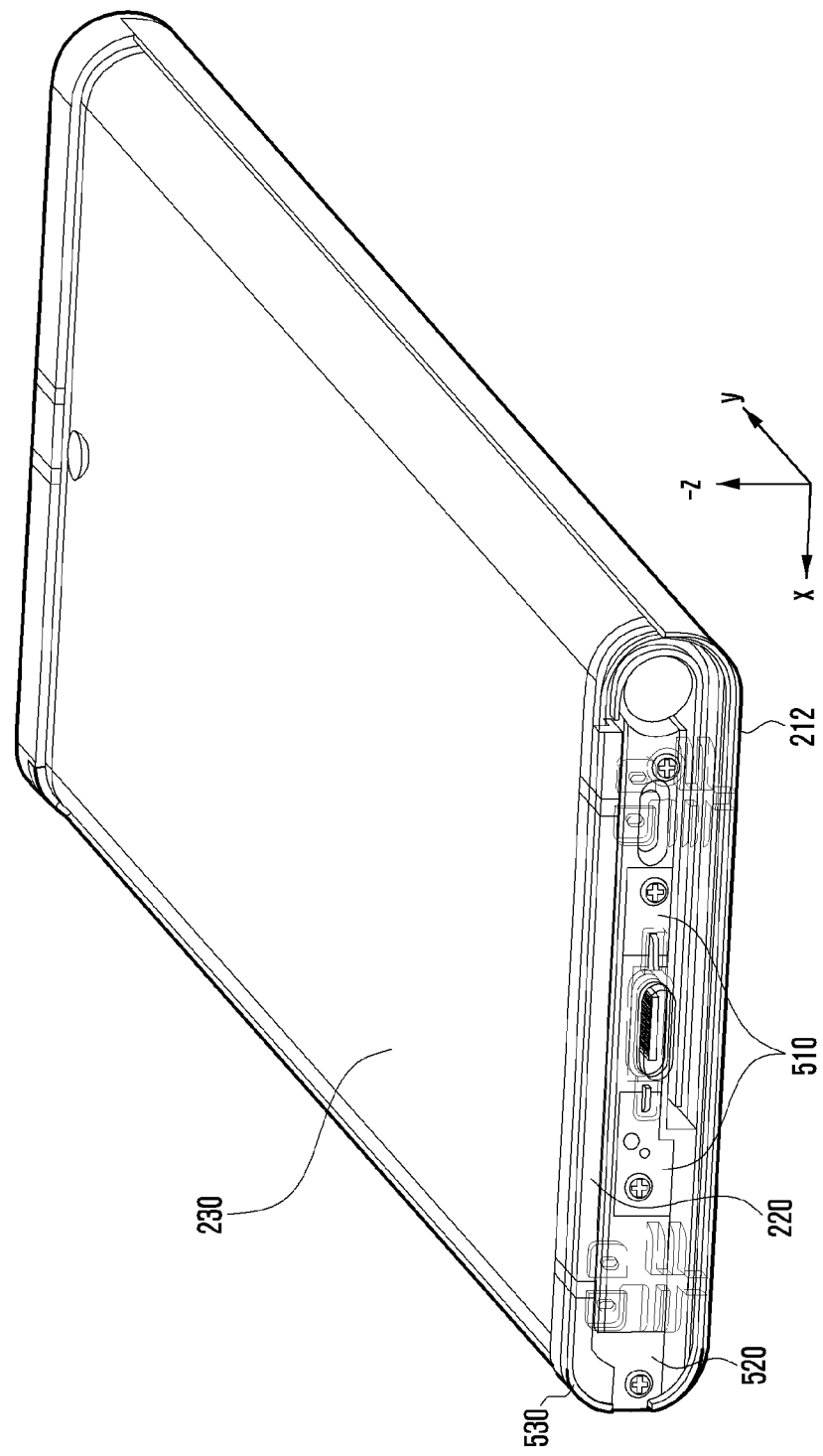
FIGS. 5A and 5B are views schematically illustrating a lower surface of an electronic device in a closed state of FIG. 2A according to various embodiments of the disclosure.
Figure 5B:
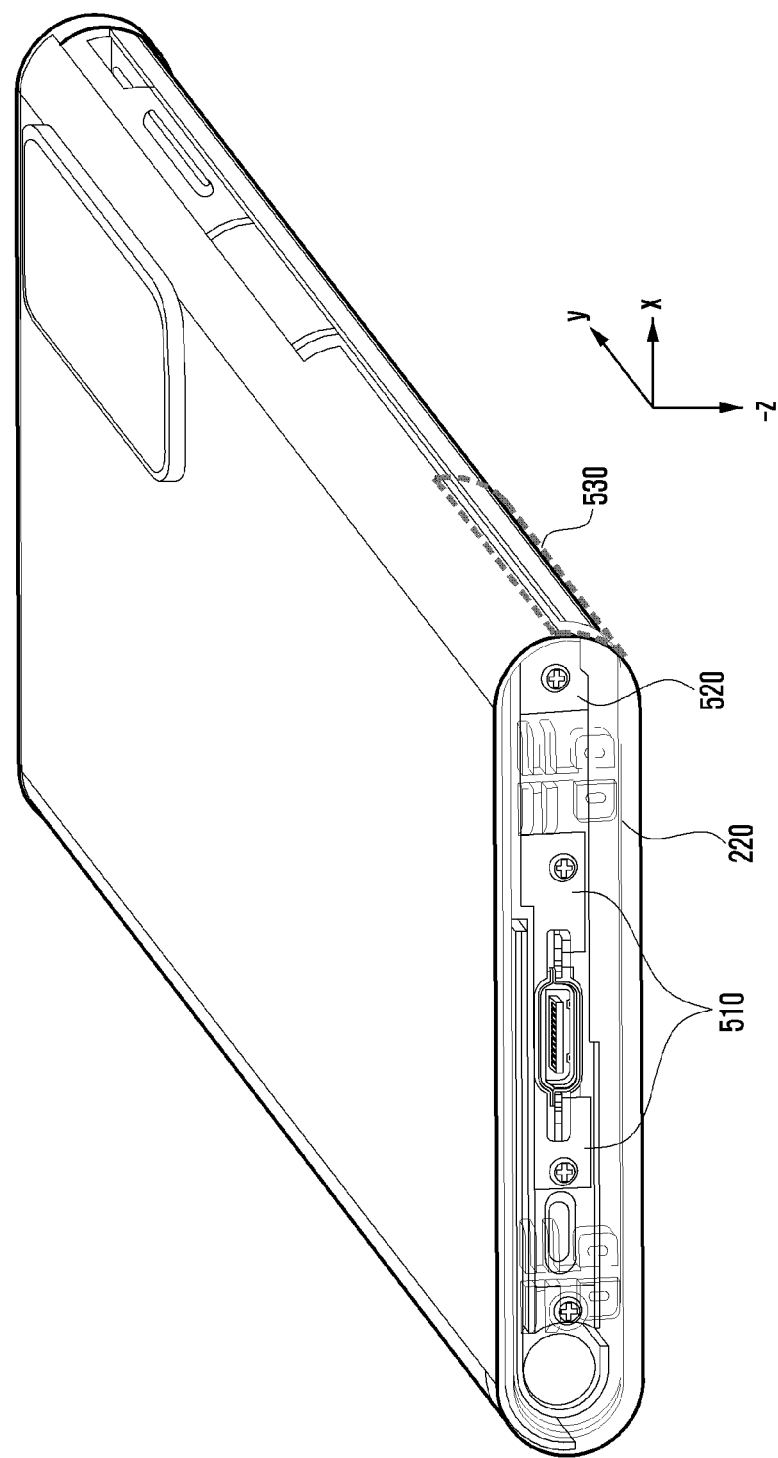

FIGS. 5A and 5B are views schematically illustrating a lower surface of an electronic device in the closed state of FIG. 2A according to various embodiments of the disclosure.

Figure 6:
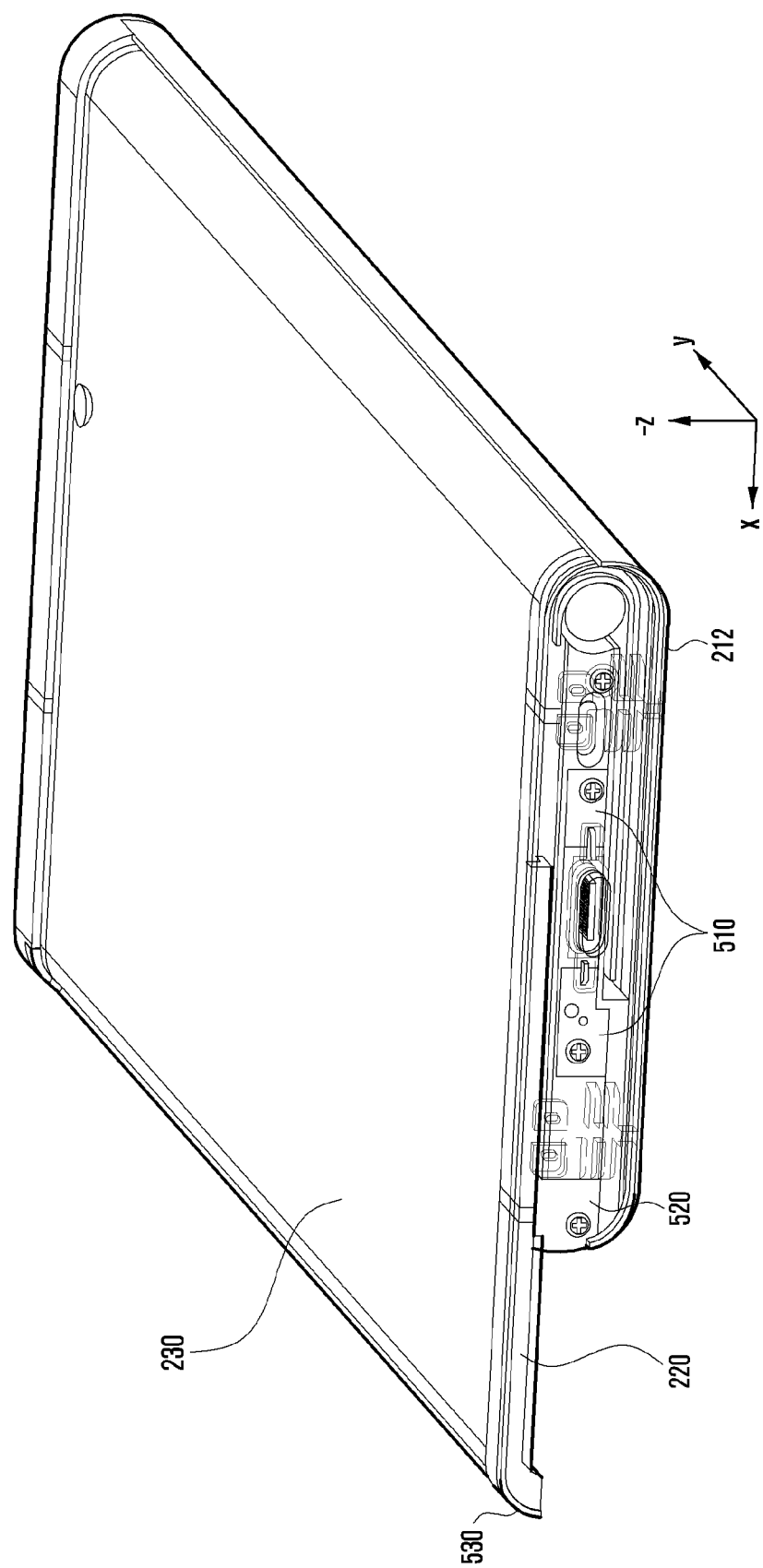
FIG. 6 is a view schematically illustrating a lower surface of the electronic device in an open state of FIG. 3A according to an embodiment of the disclosure.

FIG. 6 is a view schematically illustrating a lower surface of an electronic device in an open state of FIG. 3A according to an embodiment of the disclosure.

Referring to FIGS. 5A, 5B, and 6, the electronic device 200 may include the back cover 212, the display 230, a first conductor 510 constituted of a portion of the main portion 400, a second conductor 520 that is separated from the back cover 212 and is constituted of the other portions of the main portion 400, or a third conductor 530 (e.g., the conductive portion 221 of FIG. 4) that is constituted of a portion of the slider unit 220. Hereinafter, in the description of FIGS. 5A, 5B, and 6, portions overlapping those of FIGS. 2A to 4 may be omitted or briefly described.

According to an embodiment, each of the first conductor 510 and the second conductor 520 may be used as an antenna for a wireless communication circuit to communicate with an external electronic device through a wireless communication network. The first conductor 510 may be electrically connected to a first grip sensor (not shown). The first grip sensor may be mounted on the main portion 400 (e.g., the PCB 490) adjacent to the first conductor 510.

According to an embodiment, the third conductor 530 may be electrically connected to a second grip sensor (not shown). The second grip sensor may be mounted on the slider unit 220 adjacent to the third conductor 530. In another embodiment, the third conductor 530 may be used as an antenna while supporting the sensing of the grip.

According to an embodiment, in the closed state of FIGS. 5A and 5B and the open state of FIG. 6 in order to secure a wide sensing area of the grip, the first conductor 510 may be disposed at a position that does not overlap the third conductor 530 when viewed in the −z-axis direction.

According to an embodiment, in the closed state of FIGS. 5A and 5B, at least a portion of the third conductor 530 may be disposed at a position overlapping at least a portion of the second conductor 520 when viewed in the −z-axis direction. When the electronic device is switched to the open state of FIG. 6, the third conductor 530 may not overlap the second conductor 520.

According to various embodiments, without being limited to the embodiments of FIGS. 4, 5A and 5B, or 6, the electronic device 200 may be implemented in a manner that, when the slider unit 220 slides out, the screen is expanded while a portion of the display 230 (e.g., the bendable section ( )) is rolled up on the roller located inside the electronic device 200 and unfolds as it comes out.

Figure 7:
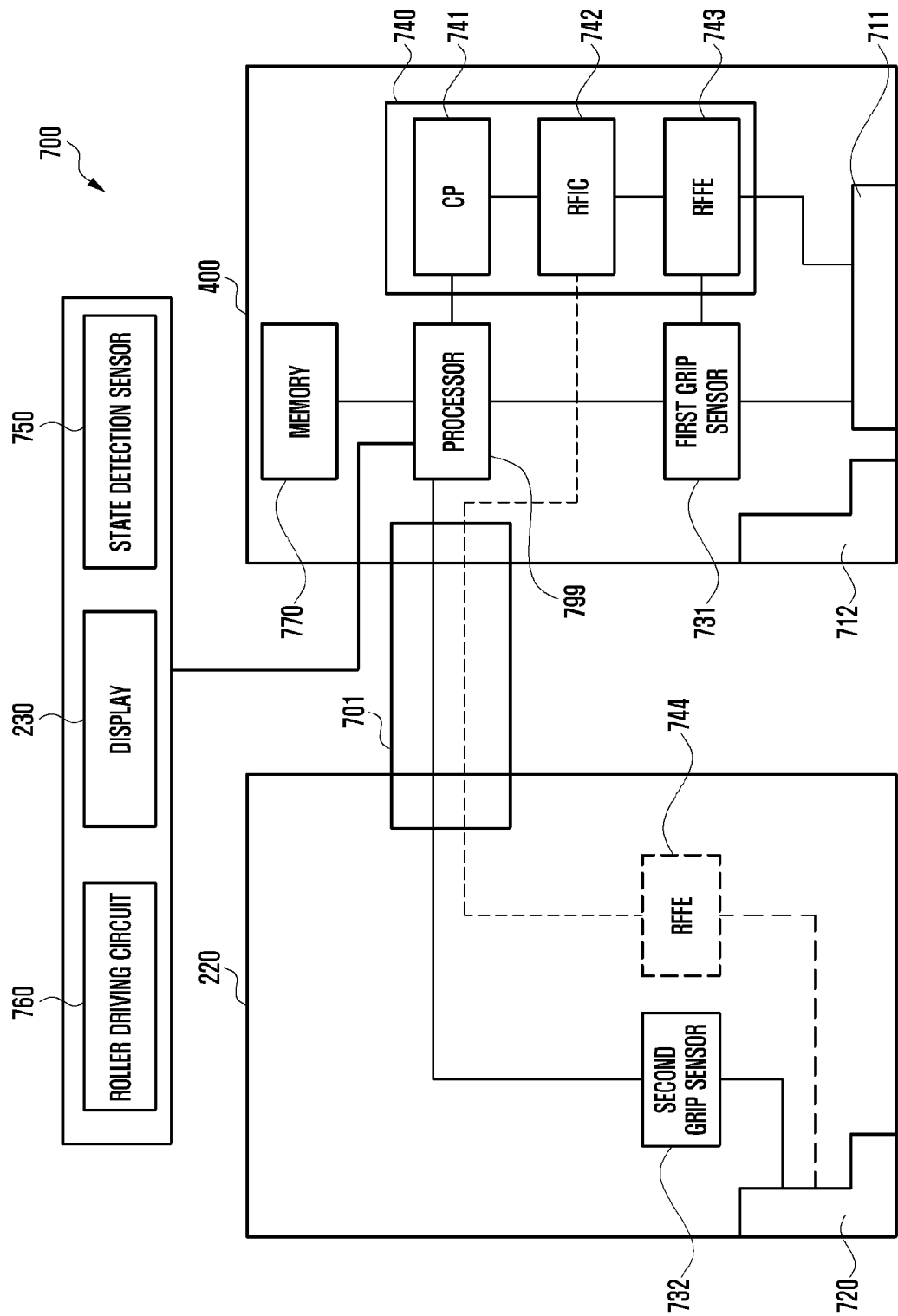
FIG. 7 illustrates configurations of an electronic device according to an embodiment of the disclosure.

FIG. 7 illustrates configurations of an electronic device according to an embodiment of the disclosure.

Referring to FIG. 7, an electronic device 700 (e.g., the electronic device 101 of FIG. 1 or the electronic device 200 of FIGS. 2A to 6) may include a display 230, a first antenna 711, a second antenna 712, a conductor 720, a first grip sensor 731, a second grip sensor 732, a wireless communication circuit 740, a state detection sensor 750, a roller driving circuit 760, a memory 770, and a processor 799.

The first antenna 711, the second antenna 712, the first grip sensor 731, the wireless communication circuit 740, the memory 770, and the processor 799 may be mounted on the main portion 400. The processor 799 (e.g., the processor 120 of FIG. 1) may be electrically connected to the first grip sensor 731, the wireless communication circuit 740, and the memory 770. The conductor 720 and the second grip sensor 732 may be mounted on the slider unit 220. The second grip sensor 732, the state detection sensor 750, the roller driving circuit 760, and the display 230 may be electrically connected to the processor 799 through a FPCB 701 (e.g., the FPCB 237 in FIG. 4). The first antenna 711 may include the first conductor 510 of FIGS. 5A, 5B, and 6. The second antenna 712 may include the second conductor 520. The conductor 720 mounted on the slider unit 220 may include the third conductor 530.

The wireless communication circuit 740 (e.g., the wireless communication module 192 of FIG. 1) may include a communication processor (CP) 741, a radio frequency integrated circuit (RFIC) 742, and a radio frequency front end (RFFE) 743.

The CP 741 may support establishment of a communication channel of a band to be used for wireless communication with the second network 199, and network communication through the established communication channel. The RFIC 742 may, upon transmission, convert a baseband signal generated by the CP 741 into a radio frequency (RF) signal used in the second network 199. Upon reception, an RF signal may be acquired from the second network 199 via an antenna (e.g., the first antenna 711 and/or the second antenna 712) and may be preprocessed via the RFFE 743. The RFIC 742 may convert a preprocessed RF signal into a baseband signal to be processed by the CP 741.

The RFFE 743 may operate in a reception mode or a transmission mode based on a control signal received from a processor (e.g., the CP 741). According to an embodiment, the RFFE 743 is a configuration for processing an RF signal before transmitting the RF signal to one of the antennas 711 and 712 or to the RFIC 742, and may include, for example, a band pass filter (BPF), a first amplifier circuit, a second amplifier circuit, and/or a switch. For example, the BPF (e.g., a surface acoustic wave (SAW) filter) may filter an RF signal of a designated frequency band from the RF signal received from one of the antennas 711 and 721, and may output the filtered RF signal to the RFIC 742. The first amplifier circuit (e.g., a low noise amplifier or a variable gain amplifier) may amplify the RF signal passing through the BPF and output the amplified RF signal to the RFIC 742. The second amplifier circuit (e.g., a driver amplifier and/or a power amplifier) may amplify the RF signal received from the RFIC 742 and may output the amplified signal to the BPF. The switch may connect the BPF to the first amplifier circuit based on the control signal received from the CP 741 in the reception mode. The switch may connect the BPF to the second amplifier circuit based on the control signal received from the CP 741 in the transmission mode. The RFFE 743 may further include circuitry (e.g., a coupler) for obtaining the power of the RF signal. For example, the circuitry may be located on a conductive path connecting the BPF and the antenna, and may obtain the power of the RF signal and may output the obtained power to another circuitry (e.g., the CP 741). In an embodiment, the CP 741 may perform a power back-off operation based on the control of the processor 799. For example, the CP 741 may control the second amplifier circuit to output an RF signal having a power value (e.g., a maximum power value−a power back-off value) configured as power back-off.

The conductor 720 may be used as a third antenna, and accordingly, a second RFFE 744 may be further provided in the electronic device 700. For example, the second RFFE 744 may be mounted on the slider unit 220 and electrically connected to the RFIC 742 through the FPCB 701.

The state detection sensor 750 (e.g., the sensor module 176 of FIG. 1) may generate data used to recognize the state (e.g., the closed state of FIG. 2A, the open state of FIG. 3A, and the intermediate state) of the slider unit 220 and may output the generated data to the processor 799. For example, the state detection sensor 750 may be attached to the roller 461, and when the roller 461 rotates, may include a sensor (e.g., an encoder or a hall sensor) that generates and outputs data corresponding to the rotation angle of the roller 461. As another example, the state detection sensor 750 may include a sensor (e.g., one or more pressure sensors) that is disposed in a designated portion (e.g., the bendable section ②) of the display 230 and generates data corresponding to the curvature of the corresponding portion.

The roller driving circuit 760 may include a motor that rotates the roller 461. The roller driving circuit 760 may rotate the roller 461 under the control of the processor 799 so that the inlet portion (e.g., the rest except for the third edge portion 220b) of the slider unit 220 can be retracted into or ejected from the inside of the housing 210. For example, the processor 799 may control the roller driving circuit 760 to perform a state transition in response to a user input for a button (e.g., a button disposed on a side of the electronic device 700 or a button displayed on the display 230) for state transition.

When a dielectric material (e.g., a finger, a palm, or a face) approaches the electronic device 700, a capacitance value measured through the grip sensor may increase. The capacitance value may include an internal capacitance component value (hereinafter, may be referred to as an "offset value") existing in the electronic device 700 itself when there is no dielectric near the electronic device 700, and an external capacitance component value due to external environmental factors of the electronic device 700.

A capacitance value measured through a grip sensor (e.g., the first grip sensor 731 and the second grip sensor 732) may be corrected using an offset value. For example, the processor 799 may obtain an external capacitance component value by subtracting the offset value from the capacitance value. The processor 799 may obtain a difference value (hereinafter, referred to as a "correction value")(=capacitance value−offset value−reference value) as a capacitance component due to the dielectric adjacent to the electronic device 700 by subtracting the reference value from the external capacitance component value. When the dielectric is adjacent to the electronic device 700, a change in capacitance value per unit time may exceed a predetermined value. The average of the external capacitance component values obtained before such a change may be configured as the reference value.

The processor 799 may determine whether to perform a power back-off operation by using the correction value. For example, when the dielectric is adjacent to the electronic device 700, the correction value may exceed a designated threshold value. In this case, the processor 799 may perform the power back-off operation. For example, the processor 799 may control the CP 741 to subtract the power of the RF signal output from the second amplifier circuit (e.g., a power amplifier) from the maximum power by the power back-off value.

Since the grip sensors (e.g., the first grip sensor 731 and the second grip sensor 732) have different positions, an offset value and a threshold value may be configured differently for each grip sensor. For example, a capacitance value measured by the first grip sensor 731 may be corrected to a first correction value using the offset value configured in the first grip sensor 731, and the first correction value may be compared with a first threshold value. A capacitance value measured by the second grip sensor 732 may be corrected to a second correction value using the offset value configured in the second grip sensor 732, and the second correction value may be compared with a second threshold. The processor 799 may perform a power back-off operation when the first correction value exceeds the first threshold or when the second correction value exceeds the second threshold.

The processor 799 may determine the priority of the grip sensor. For example, when the state of the slider unit 220 is changed, the processor 799 may first use data received from the first grip sensor 731 for determining whether to perform the power back-off. For example, the processor 799 may correct the capacitance value measured using the first grip sensor 731 by using the first offset value, and may perform the power back-off operation when the first correction value exceeds the first threshold value. When the first correction value is less than the first threshold value, the processor 799 may correct the capacitance value measured using the second grip sensor 732 by using the second offset value, and may perform the power back-off operation when the second correction value exceeds the second threshold value. The processor 799 may recognize, from the first grip sensor 731, a change in the capacitance value per unit time exceeding a predetermined value due to the approach of the dielectric to the main portion 400. According to this recognition, the processor 799 may first use data received from the first grip sensor 731 for determining whether to perform the power back-off. The processor 799 may recognize, from the second grip sensor 732, a change in the capacitance value per unit time exceeding a predetermined value due to the approach of the dielectric to the slider unit 220. According to this recognition, the processor 799 may first use data received from the second grip sensor 732 for determining whether to perform power back-off.

The memory 770 may store instructions for causing the processor 399 to perform operations for reconfiguring an offset value, a threshold value, and a power back-off value according to a state change of the slider unit 220. The above operations may be specifically described below.

When the structure of the electronic device 700 is changed, a capacitance component existing in the electronic device 700 itself may change. For example, the offset value may vary according to the state of the slider unit 220. When the offset value is fixed regardless of the state change, an unnecessary power back-off operation is performed to deteriorate radiation performance, or the power back-off operation is not performed, when necessary, which may adversely affect the human body. Accordingly, the offset value may be reconfigured according to the state change. According to an embodiment, the electronic device 700 may be configured to automatically reboot at a predetermined time. Upon rebooting, the processor 799 may calculate an offset value using a capacitance value calculated based on data received from a grip sensor (e.g., the first grip sensor 731 or the second grip sensor 732). The processor 799 may recognize a first state of the slider unit 220 based on the data received from the state detection sensor 750 and may configure the calculated offset value as a first offset value corresponding to the first state. The processor 799 may configure a second offset value corresponding to the second state of the slider unit 220 using the first offset value. For example, when the first state is the closed state, the processor 799 may configure a value obtained by subtracting a designated value from the first offset value as a second offset value corresponding to the second state (e.g., a first intermediate state, a second intermediate state in which the bendable section ② is more exposed than the first intermediate state, or an open state). The processor 799 may configure an offset value to be used when the capacitance value measured through the grip sensor is corrected, as a first offset value when the slider unit 220 is in the first state and as a second offset value when the state is changed to the second state. According to another embodiment, an offset value corresponding to each state may be stored in advance in the memory 770 without the need for a calculation process every time the reboot is performed. As described above, the offset value previously stored in the memory 770 may be an average of offset values obtained from a plurality of samples. When the state is changed, the processor 799 may identify the offset value corresponding to the changed state in the memory 770, and may configure an offset value to be used when the capacitance value measured through the grip sensor is corrected, as the identified offset value.

When the offset value is configured again, the reference value based on the offset value may also be recalculated. For example, the processor 799 may calculate the external capacitance component values using the newly changed offset value, and may reconfigure the average thereof as the reference value.

When the offset value is configured again, a threshold value compared with the correction value may also be configured again for more accurate determination of whether to perform power back-off. For example, a first threshold value corresponding to the first state and a second threshold value corresponding to the second state may be previously stored in the memory 770. When the state of the slider unit 220 is changed from the first state to the second state, the processor 799 may identify the second threshold value in the memory 770 and may configure a threshold value to be compared with the correction value as the second threshold value.

The slider unit 220 may include a metal material (e.g., the conductor 720) that affects the radiation performance of the antenna. Therefore, there may be a difference in the radiation performance of the antenna depending on the state of the slider unit 220. Such a difference may cause a problem in which, during the power back-off operation, the power value is subtracted more or less than a value required for SAR satisfaction. Accordingly, when the state is changed, a value for power back-off may be reconfigured. For example, a first power back-off value corresponding to the first state and a second power back-off value corresponding to the second state may be previously stored in the memory 770. When the state of the slider unit 220 is changed from the first state to the second state, the processor 799 may identify the second power back-off value in the memory 770, and may configure a power back-off value to be used during the power back-off operation as the second power back-off value.

The memory 770 may store a table used when configuring an offset value, a threshold value, and a power back-off value according to the state of the slider unit 220. Table 1 or Table 2 below may be stored in the memory 770. For example, when the electronic device 700 has a resilient structure that switches from a closed state to an open state or vice versa without an intermediate state, as shown in Table 2, the offset value and threshold value for each grip sensor and state may be stored in the memory 770. In addition, a power back-off value commonly usable by the grip sensor may be stored in the memory 770 for each state. When the electronic device 700 has a structure used in an intermediate state, Table 1 may be stored in the memory 770. The numerical values shown in Tables 1 and 2 are only examples, and the embodiment of the disclosure is not limited to these numerical values.

TABLE 1

| State of slider unit 220 | | Closed state | Intermediate state first stage | Intermediate state second stage | ... | Open state |
|---|---|---|---|---|---|---|
| First grip sensor 731 | Offset value | 3806 | 3805 | 3804 | ... | 3802 |
| | Threshold value | 300 | 350 | 400 | ... | 450 |
| Second grip sensor 732 | Offset value | 3706 | 3705 | 3704 | ... | 3702 |
| | Threshold value | 280 | 320 | 360 | ... | 450 |
| ... | | ... | ... | ... | ... | ... |
| Power back-off value (e.g., value for subtracting maximum power value | | 3.5 | 3 | 2 | ... | 1.5 |

TABLE 2

| State of slider unit 220 | | Closed state | Open state |
|---|---|---|---|
| First grip sensor 731 | Offset value | 3806 | 3802 |
| | Threshold value | 300 | 450 |
| Second grip sensor 732 | Offset value | 3706 | 3702 |
| | Threshold value | 280 | 450 |
| ... | | ... | ... |
| Power back-off value (e.g., value for subtracting maximum power value) | | 3.5 | 1.5 |

Figure 8:
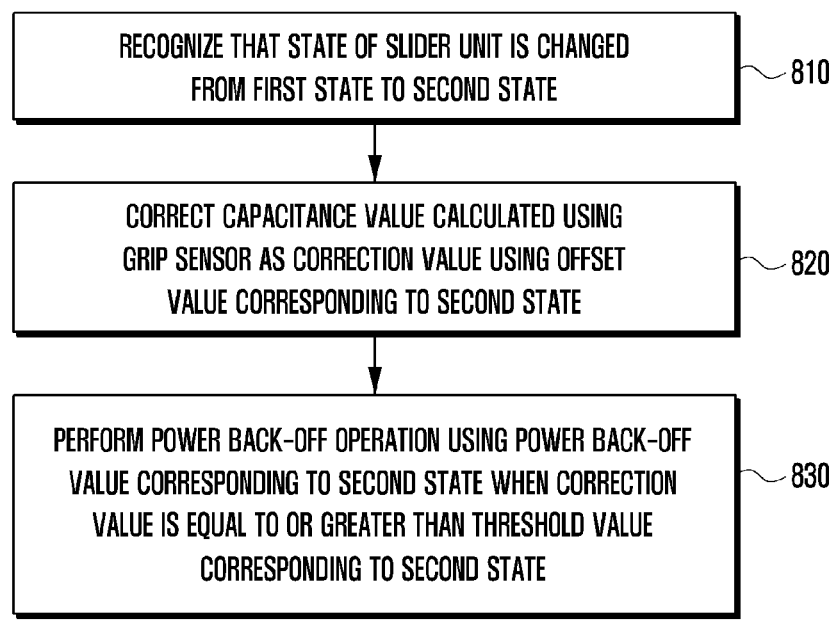
FIG. 8 illustrates operations performed by a processor for accurate and efficient power back-off in an electronic device having a slider structure according to an embodiment of the disclosure.

FIG. 8 illustrates operations performed by a processor for accurate and efficient power back-off in an electronic device having a slider structure according to an embodiment of the disclosure.

Referring to FIG. 8, in operation 810, a processor (e.g., the processor 799 of FIG. 7) may recognize that the state of the slider unit 220 is changed from the first state to the second state. For example, the processor 799 may recognize a state change based on data received from the state detection sensor 750. The transition from the first state to the second state may be a situation in which the slider unit 220 is retracted into the housing 210 or ejected from the housing 210. For example, the state transition may be 1) a transition from a closed state to an open or intermediate state, 2) a transition from an open state to an intermediate or closed state, 3) a transition from an intermediate state to an open or closed state, 4) a transition from an n-stage intermediate state to a more open n+1-stage intermediate state, or 5) a transition from an n+1-stage intermediate state to a more closed n-stage intermediate state.

In operation 820, based on the change from the first state to the second state, the processor 799 may correct a capacitance value calculated using the grip sensor as a correction value using an offset value corresponding to the second state.

In an embodiment, the processor 799 may reconfigure an offset value from a first offset value corresponding to the first state to a second offset value corresponding to the second state, may reconfigure a threshold value from a first threshold value corresponding to the first state to a second threshold value corresponding to the second state, and may reconfigure a power back-off value from a first power back-off value corresponding to the first state to a second power back-off value corresponding to the second state. The second offset value, the second threshold value, and the second power back-off value may be different from the first offset value, the first threshold value, and the first power back-off value before being reconfigured, respectively. Alternatively, at least one of the second offset value, the second threshold value, and the second power back-off value may be different from a corresponding value before being reconfigured.

In operation 820, the processor 799 may obtain a correction value using the second offset value while the slider unit 220 is maintained in the second state. For example, the processor 799 may calculate a capacitance value using data received from the grip sensor. The processor 799 may obtain an external capacitance component value by subtracting the second offset value from the capacitance value. The processor 799 may configure an average of external capacitance component values obtained for a predetermined time as a reference value. When the amount of change in the capacitance value per unit time exceeds a predetermined value, the processor 799 may obtain a correction value by subtracting the second offset value and the reference value from the capacitance value calculated using data received from the grip sensor.

When a plurality of grip sensors (e.g., a first grip sensor 731 and a second grip sensor 732) are mounted in the electronic device 700, an operation of reconfiguring an offset value and a threshold value for each of the grip sensors may be performed. In an embodiment, the processor 799 may reconfigure an offset value used to correct a capacitance value calculated using the first grip sensor 731 from an (1-1)-th offset value corresponding to the first grip sensor 731 and the first state to an (1-2)-th offset value corresponding to the first grip sensor 731 and the second state. The processor 799 may reconfigure a threshold value to be compared with a correction value calculated using a capacitance value of the first grip sensor 731 from an (1-1)-th threshold value corresponding to the first grip sensor 731 and the first state to an (1-2)-th threshold value corresponding to the first grip sensor 731 and the second state. The processor 799 may reconfigure an offset value to be used to correct a capacitance value calculated using the second grip sensor 732 from a (2-1)-th offset value corresponding to the second grip sensor 732 and the first state to a (2-2)-th offset value corresponding to the second grip sensor 732 and the second state. The processor 799 may reconfigure a threshold value to be compared with a correction value calculated using a capacitance value of the second grip sensor 732 from a (2-1)-th threshold value corresponding to the second grip sensor 732 and the first state to a (2-2)-th threshold value corresponding to the second grip sensor 732 and the second state. In operation 820, the processor 799 may obtain a correction value by using the (1-2)-th offset value or the (2-2)-th offset value while the slider unit 220 is maintained in the second state.

The processor 799 may use a table (e.g., Table 1 or Table 2) when the offset value, the threshold value, and the power back-off value are reconfigured.

In operation 830, when the correction value is equal to or greater than the threshold value (e.g., the (1-2)-th threshold value or the (2-2)-th threshold value) corresponding to the second state, the processor 799 may perform a power back-off operation using a power back-off value (e.g., second power back-off value).

When a plurality of grip sensors (e.g., the first grip sensor 731 and the second grip sensor 732) are mounted in the electronic device 700, operation 830 may be performed according to a predetermined order (or priority) for each of the grip sensors. For example, the processor 799 may first use data received from the first grip sensor 731 in determining whether the dielectric approaches to the slider unit. When the approach of the dielectric is not recognized from the data received from the first grip sensor 731, the processor 799 may determine whether the dielectric approaches the slider unit by using the data received from the second grip sensor 732. When the approach of the dielectric is recognized through the second grip sensor 732, the processor 799 may perform a power back-off operation.

In some embodiments, operations 820 and 830 may be performed by a user input. For example, the processor 799 may control the roller driving circuit 760 to change the state of the slider unit 220 from the first state to the second state in response to a user input received from an input device (e.g., a touch screen or a physical button) and may perform operations 820 and 830.

Figure 9:
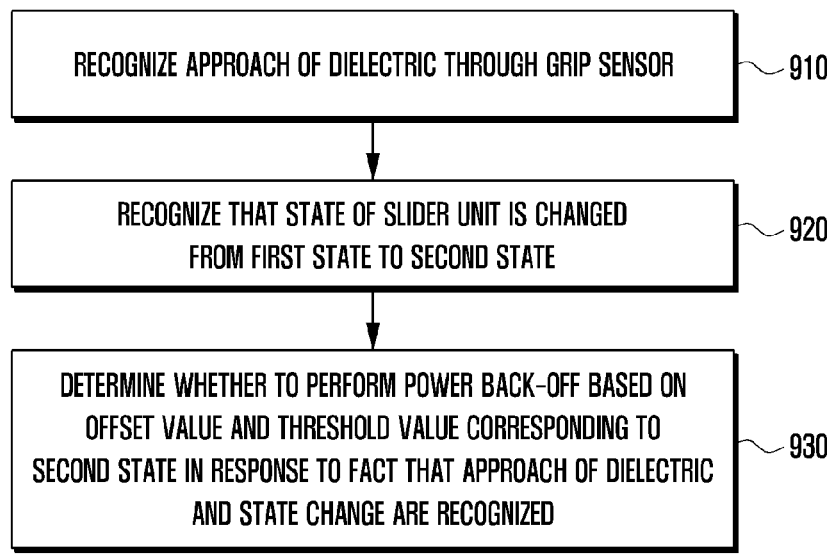
FIG. 9 illustrates operations performed by a processor for accurate and efficient power back-off in an electronic device having a slider structure, according to an embodiment of the disclosure.

FIG. 9 illustrates operations performed by a processor for accurate and efficient power back-off in an electronic device having a slider structure, according to an embodiment of the disclosure.

Referring to FIG. 9, in operation 910, the processor 799 may recognize an approach of a dielectric through a grip sensor (e.g., the first grip sensor 731 or the second grip sensor 732). For example, in a state in which an offset value and a threshold value are configured as a first offset value (e.g., the (1-1)-th offset value or the (2-1)-th offset value) and a first threshold value (e.g., the (1-1)-th threshold value or the (2-1)-th threshold value) each corresponding to the first state, the processor 799 may obtain a first correction value by subtracting the first offset value and a reference value from a capacitance value measured using data received from the grip sensor. When the first correction value is equal to or greater than the first threshold value, the processor 799 may recognize that the dielectric approaches the electronic device 700. Here, the reference value may be an average of external capacitance component values obtained before the approach of the dielectric is recognized.

In operation 920, the processor 799 may recognize that the state of the slider unit 220 is changed from the first state to the second state while the approach of the dielectric is recognized. The approach of the dielectric and the state change may be recognized substantially simultaneously. When the state change is not recognized and only the approach of the dielectric is recognized, the processor 799 may omit the following operation 930 and perform a power back-off operation.

In operation 930, the processor 799 may determine whether to perform a power back-off operation based on a second offset value (e.g., the (1-2)-th offset value or the (2-2)-th offset value) corresponding to the second state and a second threshold value (e.g., the (1-2)-th threshold value or the (2-2)-th threshold value) corresponding to the second state, in response to the fact that the approach of the dielectric and the state change are recognized. For example, the processor 799 may reconfigure an offset value from the first offset value corresponding to the first state to the second offset value corresponding to the second state, may reconfigure a threshold value from the first threshold value corresponding to the first state to the second threshold value corresponding to the second state, and may reconfigure a power back-off value from the first power back-off value corresponding to the first state to the second power back-off value corresponding to the second state. The processor 799 may obtain a second correction value by subtracting the second offset value and the reference value from the capacitance value calculated using data received from the grip sensor. When the second correction value is equal to or greater than the second threshold value, the processor 799 may perform a power back-off operation.

When a plurality of grip sensors (e.g., the first grip sensor 731 and the second grip sensor 732) are mounted in the electronic device 700, operation 930 may be performed for each grip sensor in a predetermined order. For example, the processor 799 may first use data received from the first grip sensor 731 in determining whether to perform the power back-off operation. Even if it is determined from the data received from the first grip sensor 731 that it is not necessary to perform power back-off, the processor 799 may determine whether to perform power back-off using the data received from the second grip sensor 732.

In various embodiments, a portable electronic device (e.g., the electronic device 700 of FIG. 7) may include: a housing; a slider unit having an inlet portion that can be retracted into the housing; a flexible display having a bendable section that is retracted into the housing as the inlet portion is retracted into the housing and is ejected from the housing as the inlet portion is ejected from the housing; a first antenna; a wireless communication circuit configured to be connected to the first antenna; a state detection sensor; a first grip sensor; a processor configured to be connected to the display, the wireless communication circuit, the state detection sensor, and the first grip sensor; and a memory configured to be connected to the processor, wherein the memory may store instructions that, when executed, cause the processor to perform: an operation of recognizing that the state of the slider unit is changed from a first state to a second state in which the slider unit is more retracted into the housing or is more ejected from the housing than in the first state based on data received from the state detection sensor, an operation of correcting a capacitance value calculated using the first grip sensor as a correction value using an offset value corresponding to the second state, and a power back-off operation that lowers the power of an RF signal to be output from the wireless communication circuit to the first antenna using a power back-off value corresponding to the second state when the correction value is equal to or greater than a threshold value corresponding to the second state.

The instructions may cause the processor to reconfigure an offset value used when a capacitance value calculated using the first grip sensor is corrected from an (1-1)-th offset value corresponding to the first grip sensor and the first state to an (1-2)-th offset value corresponding to the first grip sensor and the second state in response to the state change, reconfigure a threshold value to be compared with a correction value used to determine whether to perform the power back-off operation from an (1-1)-th threshold value corresponding to the first grip sensor and the first state to an (1-2)-th threshold value corresponding to the first grip sensor and the second state, and reconfigure a power back-off value used when the power back-off operation is performed from a first power back-off value corresponding to the first state to a second power back-off value corresponding to the second state.

The instructions may cause the processor to correct a capacitance value measured through the first grip sensor as a first correction value using the (1-2)-th offset value as the correction and power back-off operation, and perform a power back-off operation using the second power back-off value when the first correction value is equal to or greater than the (1-2)-th threshold value.

The portable electronic device may further include a second grip sensor, wherein the instructions may cause the processor to reconfigure an offset value used to correct a capacitance value calculated using the second grip sensor from a (2-1)-th offset value corresponding to the second grip sensor and the first state to a (2-2)-th offset value corresponding to the second grip sensor and the second state, and reconfigure a threshold value to be compared with a correction value calculated using the capacitance value of the second grip sensor from a (2-1)-th threshold value corresponding to the second grip sensor and the first state to a (2-2)-th threshold value corresponding to the second grip sensor and the second state.

The instructions may cause the processor to correct the capacitance value measured through the second grip sensor as a second correction value using the (2-2)-th offset value when the first correction value is less than the (1-2)-th threshold value, and perform a power back-off operation using the second power back-off value when the second correction value is equal to or greater than the (2-2)-th threshold value.

The portable electronic device may further include a main portion configured to be accommodated in the housing and include the first grip sensor mounted therein, wherein the second grip sensor may be mounted on the slider unit and connected to a conductor provided on the slider unit.

The first antenna may be mounted on the main portion, and the first grip sensor may be connected to the first antenna.

The portable electronic device may further include a second antenna configured to be mounted in the main portion, wherein the conductor may at least partially overlap the second antenna in a state in which the inlet portion is retracted into the housing.

In various embodiments, a portable electronic device (e.g., the electronic device 700 of FIG. 7) may include: a housing; a slider unit having an inlet portion that can be retracted into the housing; a roller configured to allow the inlet portion to be retracted into the housing or ejected from the housing; a flexible display having a bendable section that is retracted into the housing as the inlet portion is retracted into the housing and is ejected from the housing as the inlet portion is ejected from the housing; a first antenna; a wireless communication circuit configured to be connected to the first antenna; a roller driving circuit; a first grip sensor; a processor configured to be connected to the display, the wireless communication circuit, the roller driving circuit, and the first grip sensor; and a memory configured to be connected to the processor, wherein the memory may store instructions that, when executed, cause the processor to perform: an operation of controlling the roller driving circuit so that the state of the slider unit is changed from a first state to a second state in which the slider unit is more retracted into the housing or is more ejected from the housing than in the first state in response to a user input, an operation of correcting a capacitance value measured through the first grip sensor as a correction value using an offset value corresponding to the second state, and a power back-off operation that lowers the power of an RF signal to be output from the wireless communication circuit to the first antenna using a power back-off value corresponding to the second state when the correction value is equal to or greater than a threshold value corresponding to the second state.

The instructions may cause the processor to reconfigure an offset value used when a capacitance value calculated using the first grip sensor is corrected from an (1-1)-th offset value corresponding to the first grip sensor and the first state to an (1-2)-th offset value corresponding to the first grip sensor and the second state, reconfigure a threshold value to be compared with a correction value used to determine whether to perform the power back-off operation from an (1-1)-th threshold value corresponding to the first grip sensor and the first state to an (1-2)-th threshold value corresponding to the first grip sensor and the second state, and reconfigure a power back-off value used when the power back-off operation is performed from a first power back-off value corresponding to the first state to a second power back-off value corresponding to the second state.

The instructions may cause the processor to correct a capacitance value measured through the first grip sensor as a first correction value using the (1-2)-th offset value as the correction and power back-off operation, and perform a power back-off operation using the second power back-off value when the first correction value is equal to or greater than the (1-2)-th threshold value.

The portable electronic device may further include a second grip sensor, wherein the instructions may cause the processor to reconfigure an offset value used to correct a capacitance value calculated using the second grip sensor from a (2-1)-th offset value corresponding to the second grip sensor and the first state to a (2-2)-th offset value corresponding to the second grip sensor and the second state, and reconfigure a threshold value to be compared with a correction value calculated using the capacitance value of the second grip sensor from a (2-1)-th threshold value corresponding to the second grip sensor and the first state to a (2-2)-th threshold value corresponding to the second grip sensor and the second state.

The instructions may cause the processor to correct the capacitance value measured through the second grip sensor as a second correction value using the (2-2)-th offset value when the first correction value is less than the (1-2)-th threshold value, and perform a power back-off operation using the second power back-off value when the second correction value is equal to or greater than the (2-2)-th threshold value.

In various embodiments, a portable electronic device (e.g., the electronic device 700 of FIG. 7) may include: a housing; a slider unit having an inlet portion that can be retracted into the housing; a flexible display having a bendable section that is retracted into the housing as the inlet portion is retracted into the housing and is ejected from the housing as the inlet portion is ejected from the housing; an antenna; a wireless communication circuit configured to be connected to the antenna; a state detection sensor; a first grip sensor; a processor configured to be connected to the display, the wireless communication circuit, the state detection sensor, and the first grip sensor; and a memory configured to be connected to the processor, wherein the memory may store instructions that, when executed, cause the processor to perform: an operation of recognizing an approach of a dielectric through the first grip sensor, an operation of recognizing that the state of the slider unit is changed from a first state to a second state in which the slider unit is more retracted into the housing or is more ejected from the housing than in the first state based on data received from the state detection sensor while the approach of the dielectric is recognized, an operation of correcting a capacitance value measured through the first grip sensor as a correction value using an offset value corresponding to the second state based on the approach of the dielectric and the state change, and a power back-off operation that lowers the power of an RF signal to be output from the wireless communication circuit to the first antenna using a power back-off value corresponding to the second state when the correction value is equal to or greater than a threshold value corresponding to the second state.

The instructions may cause the processor to reconfigure an offset value used when a capacitance value calculated using the first grip sensor is corrected from an (1-1)-th offset value corresponding to the first grip sensor and the first state to an (1-2)-th offset value corresponding to the first grip sensor and the second state, reconfigure a threshold value to be compared with a correction value used to determine whether to perform the power back-off operation from an (1-1)-th threshold value corresponding to the first grip sensor and the first state to an (1-2)-th threshold value corresponding to the first grip sensor and the second state, and reconfigure a power back-off value used when the power back-off operation is performed from a first power back-off value corresponding to the first state to a second power back-off value corresponding to the second state.

The instructions may case the processor to correct a capacitance value measured through the first grip sensor as a first correction value using the (1-2)-th offset value as the correction and power back-off operation, and perform a power back-off operation using the second power back-off value when the first correction value is equal to or greater than the (1-2)-th threshold value.

The portable electronic device may further include a second grip sensor, wherein the instructions may cause the processor to reconfigure an offset value used to correct a capacitance value calculated using the second grip sensor from a (2-1)-th offset value corresponding to the second grip sensor and the first state to a (2-2)-th offset value corresponding to the second grip sensor and the second state, and reconfigure a threshold value to be compared with a correction value calculated using the capacitance value of the second grip sensor from a (2-1)-th threshold value corresponding to the second grip sensor and the first state to a (2-2)-th threshold value corresponding to the second grip sensor and the second state.

The instructions may cause the processor to correct the capacitance value measured through the second grip sensor as a second correction value using the (2-2)-th offset value when the first correction value is less than the (1-2)-th threshold value, and perform a power back-off operation using the second power back-off value when the second correction value is equal to or greater than the (2-2)-th threshold value.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. A portable electronic device comprising:
   a housing;
   a sliding plate configured to move with respect to the housing between a slide-in state and a slide-out state;
   a driving circuit configured to move the sliding plate;
   a first antenna;
   a wireless communication circuit connected to the first antenna;
   a first grip sensor;
   a processor connected to the wireless communication circuit, the driving circuit, and the first grip sensor; and
   memory connected to the processor,
   wherein the memory store one or more programs including instructions which, when executed by the processor, cause the portable electronic device to:
   while the sliding plate is in the slide-in state, correct a first capacitance value measured through the first grip sensor using a first offset value corresponding to the slide-in state,
   in response to a user input, control the driving circuit so that a state of the sliding plate changes from the slide-in state to the slide-out state different from the slide-in state according to a degree of movement,
   based on the sliding plate changing from the slide-in state to the slide-out state, correct the first capacitance value measured through the first grip sensor to be a correction value by using a second offset value corresponding to the slide-out state and different from the first offset value corresponding to the slide-in state, and
   in case the correction value is equal to or greater than a threshold value corresponding to the slide-out state, control to lower a power of a radio frequency (RF) signal output from the wireless communication circuit to the first antenna by using a power back-off value corresponding to the slide-out state.

2. The portable electronic device of claim 1, wherein the one or more programs further include instructions which, when executed by the processor, cause the portable electronic device to:
  reconfigure an offset value used when the first capacitance value measured through the first grip sensor is corrected from an (1-1)-th offset value corresponding to the first grip sensor and the slide-in state to an (1-2)-th offset value corresponding to the first grip sensor and the slide-out state,
  reconfigure a threshold value that is compared with a value used to determine whether to perform a power back-off operation from an (1-1)-th threshold value corresponding to the first grip sensor and the slide-in state to an (1-2)-th threshold value corresponding to the first grip sensor and the slide-out state, and
  reconfigure the power back-off value used when the power back-off operation is performed from a first power back-off value corresponding to the slide-in state to a second power back-off value corresponding to the slide-out state.

3. The portable electronic device of claim 2, wherein the one or more programs further include instructions which, when executed by the processor, cause the portable electronic device to:
  correct the first capacitance value measured through the first grip sensor to be a first correction value by using the (1-2)-th offset value, and
  perform the power back-off operation using the second power back-off value when the first correction value is equal to or greater than the (1-2)-th threshold value.

4. The portable electronic device of claim 2, further comprising:
  a second grip sensor,
  wherein the one or more programs further include instructions which, when executed by the processor, cause the portable electronic device to:
    reconfigure an offset value used to:
      correct a second capacitance value measured through the second grip sensor from a (2-1)-th offset value corresponding to the second grip sensor and the slide-in state to a (2-2)-th offset value corresponding to the second grip sensor and the slide-out state; and
    reconfigure a threshold value that is compared with a correction value calculated using the second capacitance value measured through the second grip sensor from a (2-1)-th threshold value corresponding to the second grip sensor and the slide-in state to a (2-2)-th threshold value corresponding to the second grip sensor and the slide-out state, and
  wherein the one or more programs further include instructions which, when executed by the processor, cause the portable electronic device to:
    correct the second capacitance value measured through the second grip sensor to be a second correction value by using the (2-2)-th offset value when a first correction value is less than the (1-2)-th threshold value; and
    perform the power back-off operation by using the second power back-off value when the second correction value is equal to or greater than the (2-2)-th threshold value.

5. The portable electronic device of claim 1, wherein the second offset value is determined by subtracting a designated value from the first offset value.

6. The portable electronic device of claim 1, wherein the one or more programs further include instructions which, when executed by the processor, cause the portable electronic device to:
  based on the sliding plate being in the slide-in state, configure to use the first offset value when correcting the first capacitance value measured through the first grip sensor, and
  based on the sliding plate changing from the slide-in state to the slide-out state, configure to use the second offset value when correcting the first capacitance value measured through the first grip sensor.

\* \* \* \* \*